(12) United States Patent
Yamasaki

(10) Patent No.: US 7,420,608 B2
(45) Date of Patent: Sep. 2, 2008

(54) DISPLAY DEVICE WITH IMAGE SENSING DEVICE

(75) Inventor: Ryo Yamasaki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 664 days.

(21) Appl. No.: 10/869,717

(22) Filed: Jun. 16, 2004

(65) Prior Publication Data

US 2004/0263670 A1 Dec. 30, 2004

(30) Foreign Application Priority Data

Jun. 18, 2003 (JP) ............................ 2003-173735

(51) Int. Cl.
*H04N 5/222* (2006.01)
*H04N 5/262* (2006.01)
*G02F 1/1333* (2006.01)

(52) U.S. Cl. ................... 348/333.01; 348/340; 349/56; 345/104

(58) Field of Classification Search ............ 348/333.01, 348/340
See application file for complete search history.

(56) References Cited

U.S. PATENT DOCUMENTS

| 5,194,955 | A | * | 3/1993 | Yoneta et al. ............. 348/14.01 |
| 5,414,547 | A | * | 5/1995 | Matsuo et al. .................. 349/44 |
| 5,463,216 | A | * | 10/1995 | Van Berkel ............... 250/208.1 |
| 5,585,817 | A | * | 12/1996 | Itoh et al. .................... 345/104 |
| 5,648,655 | A | * | 7/1997 | Rostoker .................. 250/208.1 |
| 5,760,834 | A | * | 6/1998 | Rostoker ..................... 348/340 |
| 5,777,665 | A | * | 7/1998 | McNelley et al. ......... 348/14.16 |
| 6,454,414 | B1 | * | 9/2002 | Ting ............................. 353/28 |
| 6,771,303 | B2 | * | 8/2004 | Zhang et al. ............. 348/14.16 |
| 7,034,866 | B1 | * | 4/2006 | Colmenarez et al. ... 348/211.12 |
| 7,042,486 | B2 | * | 5/2006 | Manico et al. ................ 348/61 |
| 2002/0030775 | A1 | * | 3/2002 | De Schipper ............... 349/113 |
| 2003/0193599 | A1 | * | 10/2003 | Campbell et al. ...... 348/333.01 |
| 2004/0140973 | A1 | * | 7/2004 | Zanaty ........................ 345/214 |

FOREIGN PATENT DOCUMENTS

| JP | 10-070713 | 3/1998 |
| JP | 3207319 | 7/2001 |
| JP | 2002-209226 A | 7/2002 |
| JP | 2002-314899 | 10/2002 |

OTHER PUBLICATIONS

Chinese Office Action dated Nov. 9, 2007.

* cited by examiner

*Primary Examiner*—David Ometz
*Assistant Examiner*—Wanda M Negron
(74) *Attorney, Agent, or Firm*—Morgan & Finnegan LLP

(57) ABSTRACT

The object of this invention is to provide a display device with an image sensing device, which can match lines of sight by a simple arrangement and realize a high pixel density, low cost and low profile. To this end, the display device with an image sensing device has a display unit that includes a plurality of display pixels, a light-shielding member arranged between neighboring display pixels, and an image sensing unit arranged on a back portion of the display unit; the light-shielding member has an opening for guiding light toward the image sensing unit and the image sensing unit has an imaging lens at a position corresponding to the opening.

4 Claims, 35 Drawing Sheets

F I G. 10
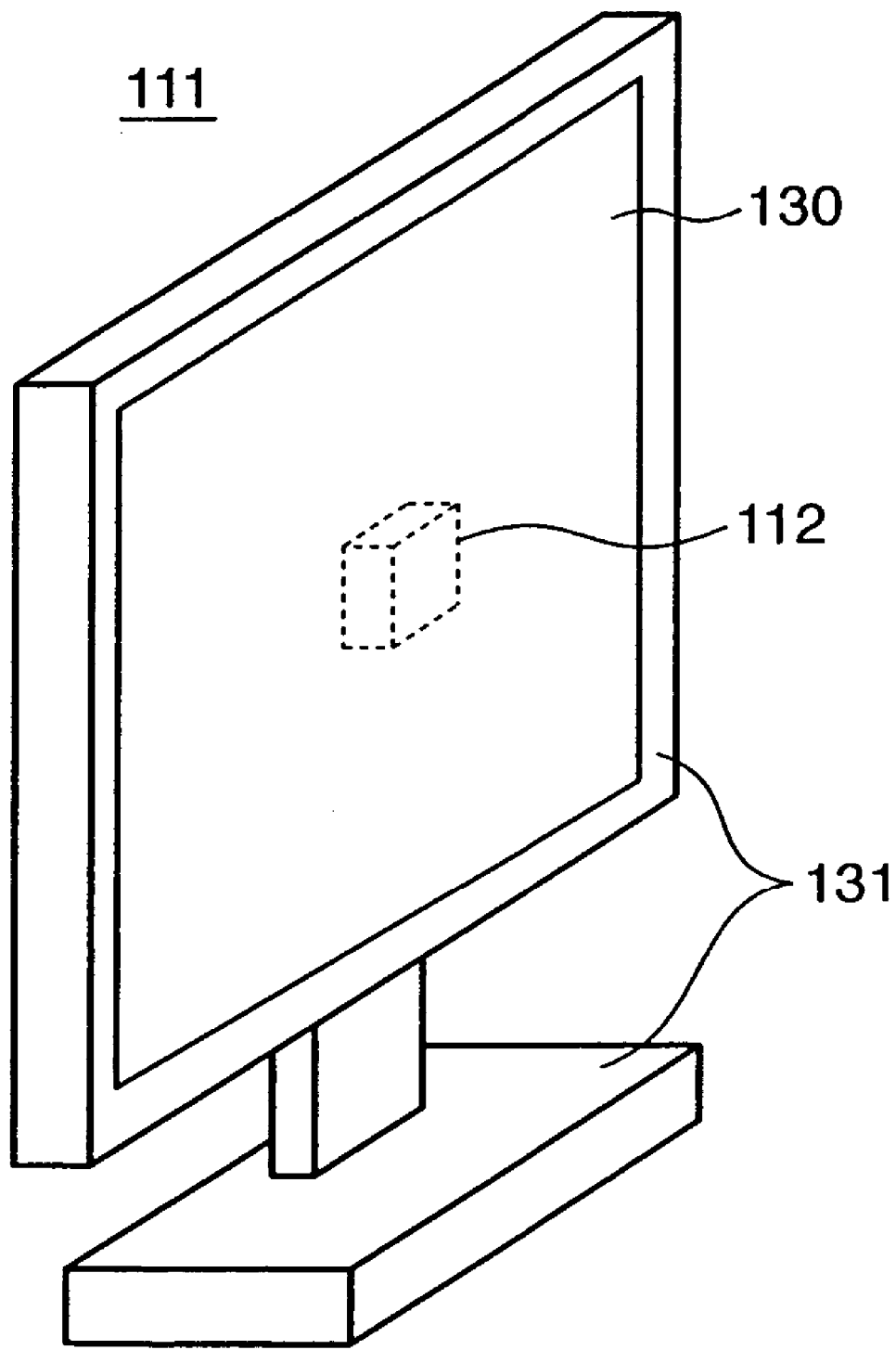

F I G. 26
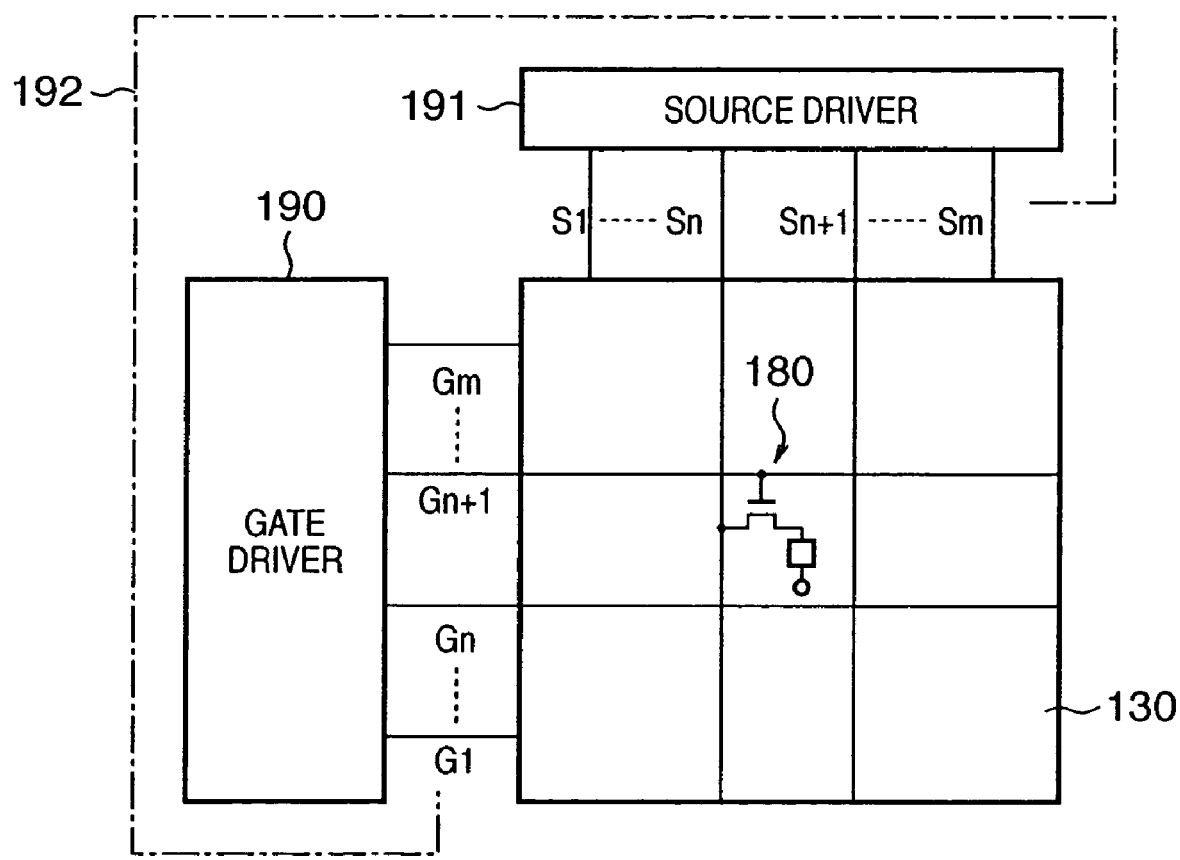

DISPLAY DEVICE WITH IMAGE SENSING DEVICE

FIELD OF THE INVENTION

The present invention relates to a display device with an image sensing device, in which an image sensing device is integrally provided to a relatively low-profile display device such as an organic EL, liquid crystal, plasma system, or the like and, more particularly, to a display device with an image sensing device, which is suitably used in real-time, two-way communications using a video phone or the like.

BACKGROUND OF THE INVENTION

In recent years, remarkable development of communication networks allows real-time, two-way communications using video phones or the like. The video phone comprises image sensing means for converting an object image into an electrical image signal, and display means for converting the electrical image signal into an optical signal, and displaying that optical signal. The user of the video phone talks while observing the partner's face displayed on the screen of the display means. At the same time, the image of the user's face is sensed and is converted into an electrical signal by the image sensing means, and the electrical signal is sent to the partner side. However, in a conventional device such as a video phone or the like, which is used in two-way communications, the image sensing means is provided in the neighborhood of the display means or as another independent device, and obliquely senses a recipient who observes the display means. For this reason, the partner's face displayed on the display means gazes another place, thus feeling awkward if they talk with each other, and feeling odd compared to a face-to-face conversation. Also, the image sensing device and display device must be independently manufactured and assembled as independent devices, resulting in high manufacturing cost.

To solve these problems, Japanese Patent Laid-Open No. 10-70713 discloses an arrangement which comprises the image sensing means within a display area of the display means. FIGS. 33, 34, and 35 show this prior art: FIG. 33 is an overall perspective view, FIG. 34 is an enlarged sectional view taken along a line A-A' in FIG. 33; and FIG. 35 shows the image sensing principle of an object. As shown in FIGS. 33 and 34, a transmissive image sensing device integrated display device comprises a display device 1 and transmissive image sensing device 2. The display device 1 is a transmissive liquid crystal display device, and is illuminated with illumination light 5 from behind. The transmissive image sensing device 2 comprises windows 3 which are laid out in a matrix pattern, and microlenses 4 arranged at the intersections of the windows. A video on the display device 1 illuminated with the illumination light 5 is observed via the windows 3 of the transmissive image sensing device 2. The microlenses 4, photodiodes 26, and the like of the transmissive image sensing device are provided on a TFT 10 of the display device 1. Therefore, both image sensing and display functions can be achieved. One microlens 4 and photodiode 26 obtain one image sensing signal.

The image sensing principle of an object by such multi-eye image sensing element will be described below using FIG. 35. FIG. 35 is a vertical sectional view of the transmissive image sensing device 2. The photodiodes 26 are arranged at given intervals on a transparent glass substrate 21 to form a photodiode array 38, and each individual photodiode 26 is covered by a light-shielding layer 30, which has a pinhole 31. A microlens array 35, which is formed by the microlenses 4 corresponding to the individual photodiodes 26, is arranged in front of the photodiode array 38. An object 39 is located in front of the microlens array 35, and external light beams 37 from the object 39 enter the individual photodiodes 26, as shown in FIG. 35. Therefore, each photodiode 26 receives only light 37 in a specific direction that connects the pinhole 31 and the optical center of the microlens 4. If all the external light beams 37 transmitted through the microlens array 35 are parallel to each other, the object 39 located in front of the transmissive image sensing device 2 is sensed to have a size as large as the image sensing device 2.

With this arrangement, an image sensing operation can be made while observing the display means, and the line of sight of the user can match that of the partner displayed on the display means. Since the low-profile image sensing means is provided on the front surface of the display means, the overall device can be prevented from being bulky.

However, the aforementioned prior art suffers the following problems.

(1) The number of pixels of a sensed image is nearly equal to that of the display device, and cannot be increased beyond the number of display pixels.

(2) Since the photodiodes with poor manufacturing yield are formed to have a large substrate size like the display device, the number of photodiodes that can be formed per substrate is small, resulting in high cost.

(3) Photoelectric converters that form the windows are discretely arranged, thus generating moiré stripes.

SUMMARY OF THE INVENTION

Therefore, the present invention has been made in consideration of the above problems and has as its object to provide a display device with an image sensing device, which can match each other's lines of sight by a simple arrangement, and can realize a high pixel density, low cost, and low profile.

It is another object of the present invention to obtain a high-quality image free from any moiré stripes.

In order to solve the aforementioned problems and to achieve the above objects, according to the first aspect of the present invention, a display device with an image sensing device according to an embodiment is comprising: display means comprising a plurality of display pixels, and a light-shielding member arranged between neighboring ones of the plurality of display pixels; and image sensing means arranged on a back portion of the display means, and in that the light-shielding member has an opening for guiding light toward the image sensing means, and the image sensing means comprises imaging means at a position corresponding to the opening.

Also, according to the second aspect of the present invention, a display device with an image sensing device according to an embodiment is comprising: display means comprising a plurality of display pixels, and a light-shielding member arranged between neighboring ones of the plurality of display pixels; and a plurality of image sensing means arranged on a back portion of the display means, and in that the light-shielding member has a plurality of openings for guiding light toward the image sensing means, and the plurality of openings are arranged at a pitch corresponding to an integer multiple of the display pixel.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 10 is a perspective view showing the outer appearance of the display device with the image sensing device;

FIG. 26 is a block diagram showing the electrical arrangement of display means;

DETAILED DESCRIPTION OF THE PREFERRED EMBODIMENTS

Figure 1:
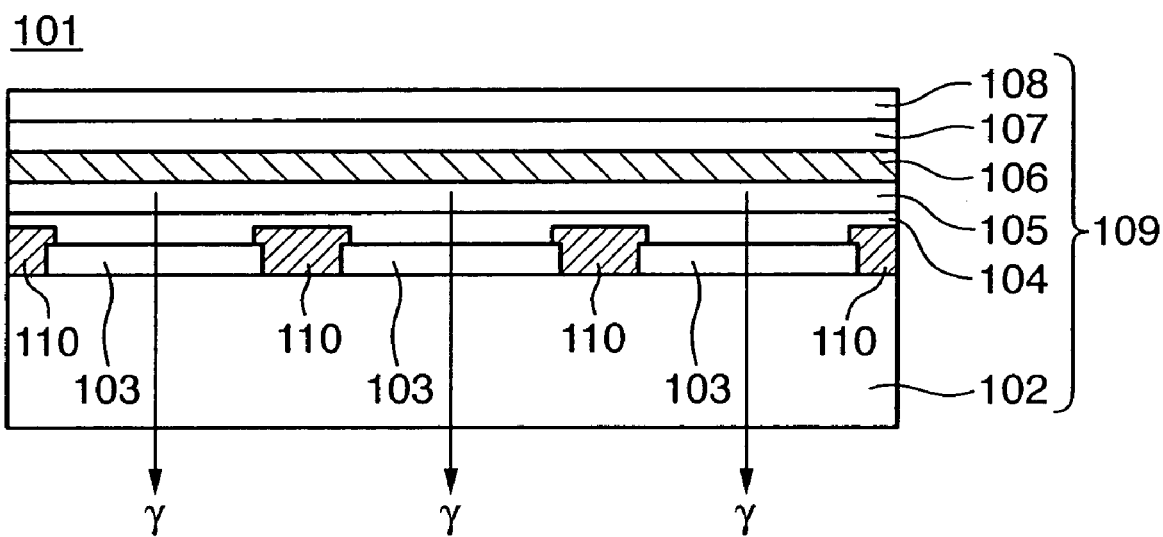
FIG. 1 is a partial sectional view of a simple matrix organic EL display device.

Preferred embodiments of the present invention will be described hereinafter.

An outline of an embodiment of the present invention will be explained first.

A display device with an image sensing device according to an embodiment is comprising: display means comprising a plurality of display pixels, and a light-shielding member arranged between neighboring ones of the plurality of display pixels; and image sensing means arranged on a back portion of the display means, and in that the light-shielding member has an opening for guiding light toward the image sensing means, and the image sensing means comprises imaging means at a position corresponding to the opening.

A display device with an image sensing device according to another embodiment is comprising: display means comprising a plurality of display pixels, and a light-shielding member arranged between neighboring ones of the plurality of display pixels; and a plurality of image sensing means arranged on a back portion of the display means, and in that the light-shielding member has a plurality of openings for guiding light toward the image sensing means, and the plurality of openings are arranged at a pitch corresponding to an integer multiple of the display pixel.

The display device with the image sensing device according to this embodiment is wherein the display pixel near the opening is partially used for the opening.

The display device with the image sensing device according to this embodiment is wherein the plurality of image sensing means perform a pixel-shift photographing operation for an object at a predetermined distance.

The preferred embodiments of the present invention will be described in detail hereinafter with reference to the accompanying drawings.

First Embodiment

The first embodiment is an example using an organic EL (EL: Electro Luminescence) element as display means. The organic EL element is a self-emission element, and has excellent features: (1) high light-emitting efficiency; (2) a low driving voltage; (3) various colors (green, red, blue, yellow, and the like) can be displayed by selecting light-emitting materials; (4) no backlight is required; (5) no dependence on the field angle due to surface emission; (6) low-profile and lightweight; and so forth, when it is used in a display device. Hence, a display device using an organic EL element has received a lot of attention as a display device that replaces a CRT and LCD. Prior to a description of this embodiment, an organic EL display device will be explained.

Dot-matrix organic EL display devices which make display by means of dots arranged in a matrix are classified into a simple matrix system and active matrix system.

The simple matrix system externally and directly drives organic EL elements of respective pixels arranged in a matrix on a display panel in synchronism with scan signals, and the display panel of the display device is made up of only organic EL elements. For this reason, when the number of scan lines increases, a drive time (duty) assigned per pixel is reduced, and contrast lowers. However, a simple manufacturing process and a cost reduction can be attained.

Figure 2:
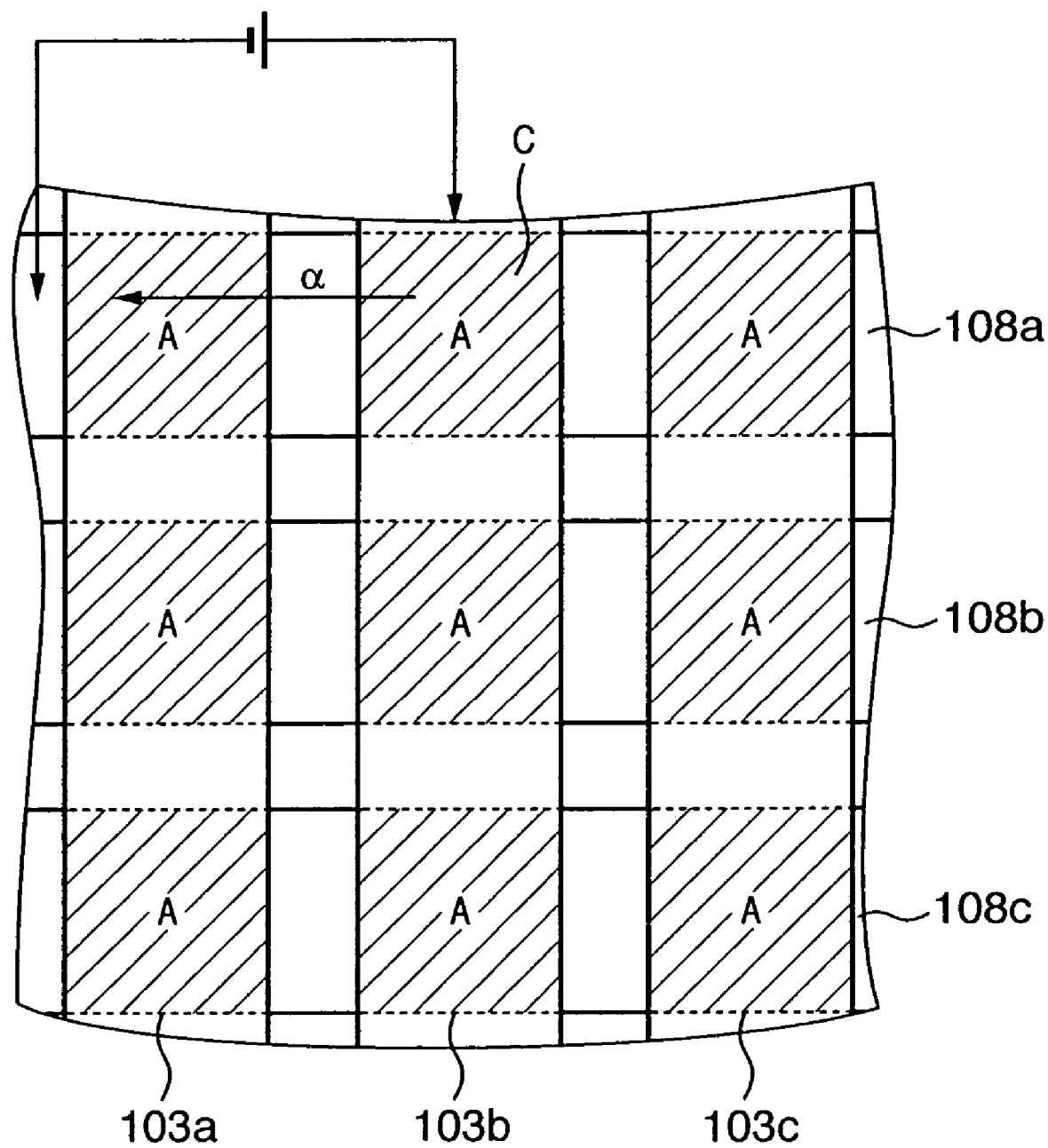
FIG. 2 is a plan view of the organic EL display device when viewed from the anode side.
Figure 3:
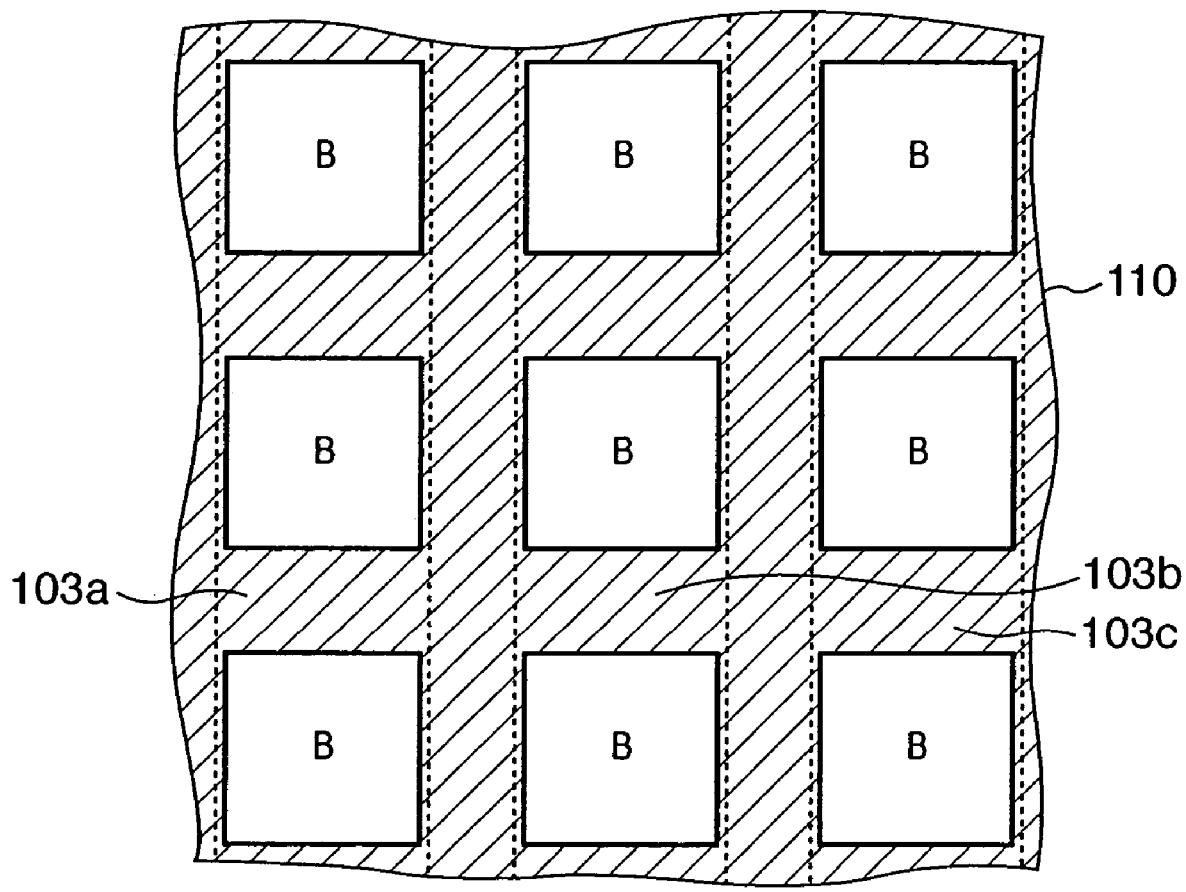
FIG. 3 is a plan view of the organic EL display device when viewed from the cathode side.

FIGS. 1 to 3 show an organic EL display device of the simple matrix system. FIG. 1 is a partial sectional view of an organic EL display device 101 of the simple matrix system.

A plurality of anodes 103 formed of transparent electrodes (e.g., ITO (Indium Tin Oxide) or the like), first hole transport layer 104, second hole transport layer 105, light-emitting layer 106, electron transport layer 107, and a plurality of cathodes 108 formed of a magnesium-indium alloy are stacked and formed in the order named on a transparent insulating substrate 102 formed of a glass, synthetic resin, or the like. In this way, the layers 104 to 107 are formed of organic compounds, and these layers 104 to 107, and each anode 103 and cathode 108 form an organic EL element 109.

A black matrix 110 formed of a light-shielding film having an insulating property as a light-shielding member is formed on the transparent insulating substrate 102 exposed from the neighboring anodes 103. That is, the black matrix 110 is embedded between the neighboring anodes 103. As the materials of the black matrix 110, coated insulating films (silicon-based resin film, polyimide-based resin film, SOG (Spin On Glass) film, and the like) containing fine particles (carbon black or the like) having a light-shielding property, high-polymer films having a light-shielding property, and the like may be used, and the materials to be used are not particularly limited as long as they do not adversely influence the anodes 103.

In the organic EL element 109, holes injected from the anode 103 and electrons injected from the cathode 108 recombine inside the light-emitting layer 106, and excite organic molecules that form the light-emitting layer 106, thus producing excitons. During the radiation/deactivation process of the excitons, light is emitted from the light-emitting layer 106, and is externally output from the transparent anode 103 via the transparent insulating substrate 102, as indicated by an arrow $\alpha$.

The hole transport layers 104 and 105 have a function of facilitating injection of holes from the anodes 103 and a function of blocking electrons injected from the cathodes 108. Also, the electron transport layer 107 has a function of facilitating injection of electrons from the cathodes 108.

With the organic EL display device 101 with such structure, the monochrome light-emitting organic EL elements 109 with high light-emitting efficiency can be obtained, and the luminance of the organic EL display device 101 can be improved.

In order to realize a full-color organic EL display device 101, the following five methods are proposed. (1) White light-emitting organic EL elements are combined with R, G, and B color filters. (2) B (blue) light-emitting organic EL elements are converted into R, G, and B light-emitting elements via a CCM (Color Changing Media) layer. (3) R, G, and B organic layers are selectively formed using a shadow mask. (4) R, G, and B organic EL elements are stacked in the vertical direction to independently emit light. (5) High-polymer organic layers are selectively painted by ink-jet printing to emit R, G, and B light beams.

FIG. 2 is a plan view of the organic EL display device 101 when viewed from the anode 103 side. Note that FIG. 2 does not illustrate members other than the anodes 103 and cathodes 108. The anodes 103 are arranged parallel to each other, and the cathodes 108 are also arranged parallel to each other. The anodes 103 and cathodes 108 are arranged to be perpendicular to each other.

In the organic EL elements 109, light-emitting regions A are formed on regions sandwiched between the intersecting anodes 103 (103a to 103c) and cathodes 108 (108a to 108c), that is, on the hatched regions in FIG. 2, and these light-emitting regions A emit light by the aforementioned process. More specifically, light-emitting regions A arranged in a matrix serve as display pixels of the organic display device 101.

In the simple matrix system, the plus side of a drive power supply is connected to the anode 103 corresponding to light-emitting region A to be controlled to emit light, the minus side of the drive power supply is connected to the cathode 108 corresponding to that light-emitting region A, and these anode 103 and cathode 108 are energized.

For example, when light-emitting regions A located at the intersections between the anodes 103 and cathode 108a are to be controlled to emit light, the anodes 103 are connected to the plus side, and the cathode 108a is connected to the minus side, thus energizing them. Then, a forward current flows, as indicated by an arrow $\alpha$.

FIG. 3 shows the organic EL display device 101 when viewed from the cathode 108 side, and does not illustrate members other than the black matrix 110 and anodes 103. The anodes 103a to 103c are formed below the black matrix 110, and are indicated by the dotted lines. On the black matrix 110, regions corresponding to light-emitting regions A in FIG. 2 are formed as opening regions B. Regions other than light-emitting regions A are formed to shield light, and serve to prevent light leakage.

Since the organic EL display device of this embodiment comprises the black matrix 110, any optical crosstalk due to leak current characteristics of EL elements and that due to scattering of light resulting from the structure of EL element hardly occur. Therefore, the organic EL display device 101 has high contrast, and can improve the resolution, thus obtaining a high-definition image. When the present invention is applied to a full-color organic EL display device, a sharp image free from any color "blur" can be obtained.

The arrangement of the organic EL display device has been explained. This embodiment uses such organic EL display device as display means.

Figure 4:
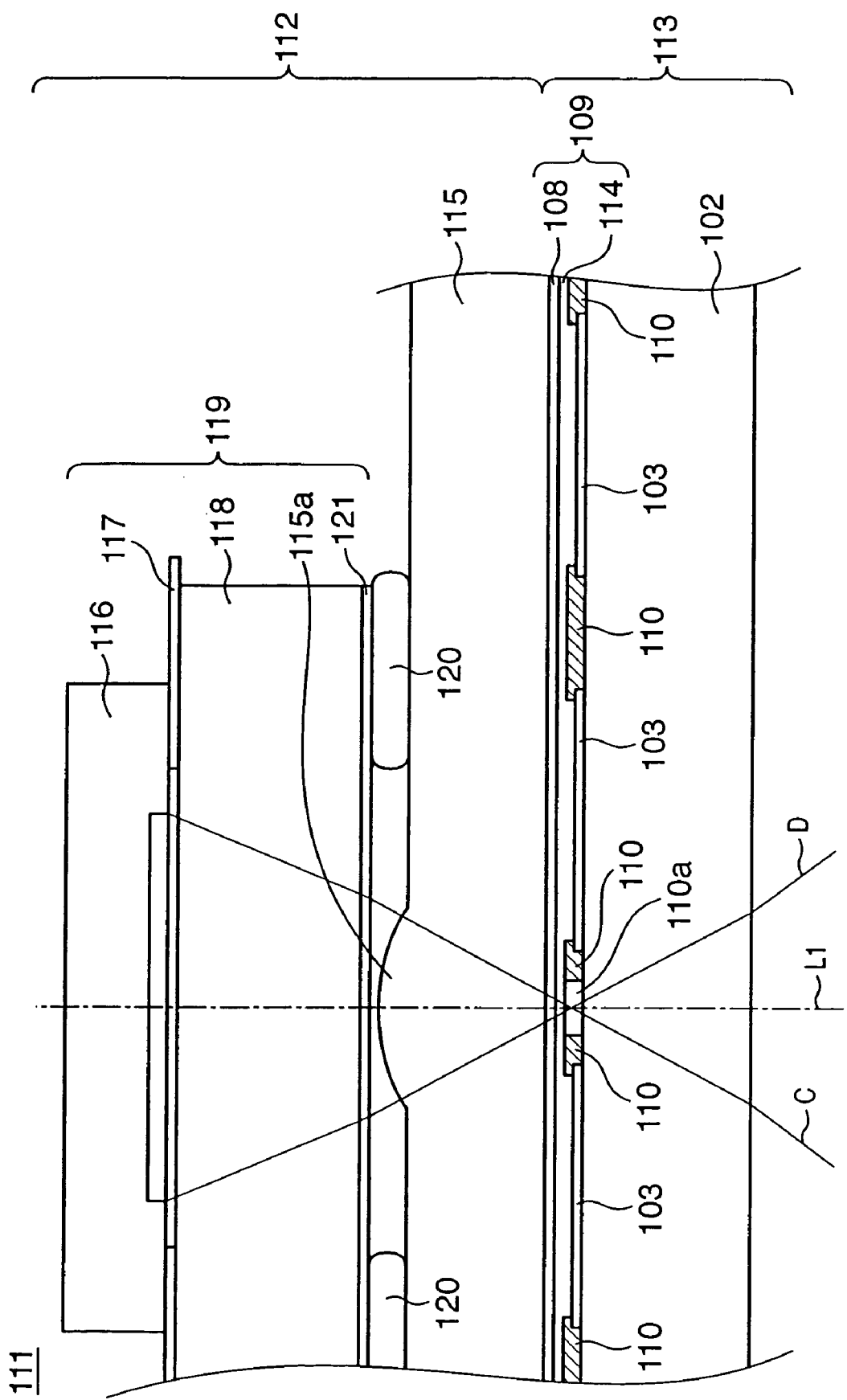
FIG. 4 is a partially enlarged, schematic sectional view of a display device with an image sensing device according to the first embodiment.

FIG. 4 is a partially enlarged, schematic sectional view of a display device with an image sensing device according to the first embodiment of the present invention.

Referring to FIG. 4, reference numeral 111 denotes a display device with an image sensing device, which comprises image sensing means 112 and display means 113. The display means 113 adopts the organic EL display device 101 in FIG. 1. As in the display device 101, a plurality of anodes 103 formed of transparent electrodes (e.g., ITO (Indium Tin Oxide) or the like) are formed on a transparent insulating substrate 102 formed of a glass, synthetic resin, or the like, and a black matrix 110 is formed between neighboring anodes 103. Reference numeral 114 denotes an organic layer, which is stacked on the upper surfaces of the anodes 103 and black matrix 110, and includes the first hole transport layer 104, second hole transport layer 105, light-emitting layer 106, and electron transport layer 107 in FIG. 1. A plurality of cathodes 108 formed of a magnesium-indium alloy are stacked and formed on the upper surface of the organic layer 114. The arrangement of the display means 113 has been explained, and is the same as that of the organic EL display device 101 that has been explained using FIGS. 1 to 3.

The arrangement of the image sensing means 112 will be explained below. A replica layer 115 which integrally comprises a lens 115a is stacked on the upper surfaces of the cathodes 108. The replica layer 115 is generally prepared by metal molding using an ultraviolet setting resin or the like, and can easily realize a high-precision surface or spherical/aspherical surface shape of an imaging lens, or a lens array on which lenses are arranged at higher density. Note that an imaging lens generally preferably uses an acrylic resin.

The electrodes of the organic EL elements 109 readily oxidize in the presence of a very slight amount of oxygen or moisture, and form a non-emitting portion called an oxidized dark spot. Such dark sport extends and disturbs light emission as time elapses. In this embodiment, the transparent insulating substrate 102 and replica layer 115 completely seal the organic EL elements 109 each including the anode 103, organic layer 114, and cathode 108. Hence, the replica layer 115 not only forms the lens 115a but also serves to seal the EL elements. Note that the replica layer 115 is required to have a certain thickness to completely seal an external air since it is formed of a resin. If the replica layer 115 alone cannot provide complete sealing, measures may be taken: a coat is applied to the replica layer 115, a metal film coat is applied to the replica layer 115 except for the lens 115a, the overall device is sealed, and so forth.

Referring back to FIG. 4, the lens 115 is an imaging lens formed of an aspherical shape, and L1 indicates the optical axis of the lens 115a. An opening 110a is formed on the black matrix 110 at an intersection with the optical axis L1, and serves as an aperture stop of the lens 115a.

In this manner, a light beam which is transmitted through the transparent insulating substrate 102, opening 110a, and organic layer 114 forms an image via the lens 115a. Note that the organic layer 114 is a thin film, and visible light is normally transmitted through that layer. If the organic layer 114 intercepts visible light, openings may also be formed in the organic layer 114. In this embodiment, no opening is formed in the organic layer 114 so as to eliminate complexity of the manufacturing process as much as possible.

Figure 5:
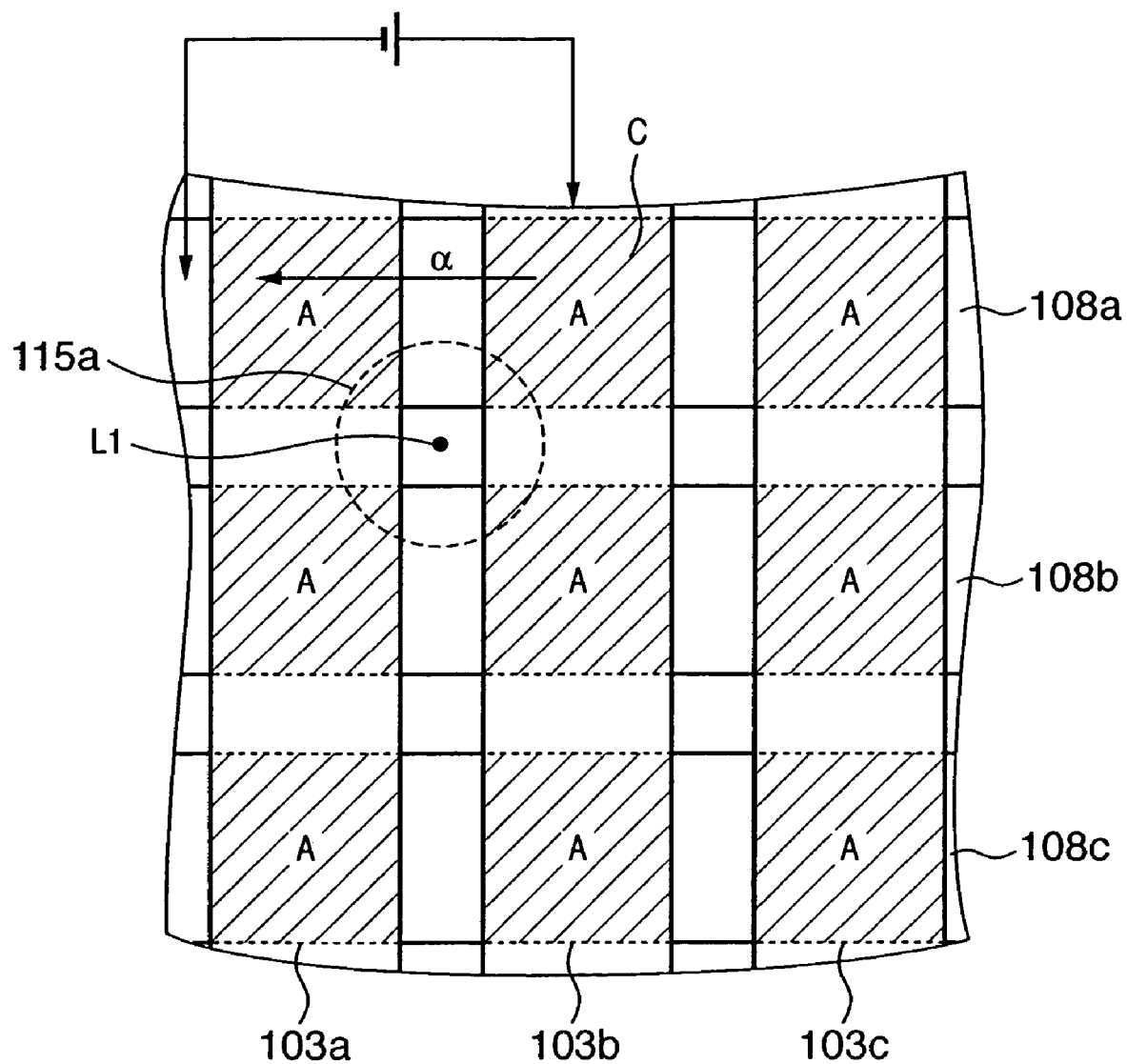
FIG. 5 is a plan view of display means in FIG. 4 when viewed from the anode side.

FIG. 5 is a plan view of the display means 113 in FIG. 4 when viewed from the anode 103 side. Note that FIG. 5 does not illustrate members other than the anodes 103 and cathodes 108. In FIG. 5, the dotted circle corresponds to the lens 115a, and is formed on a region sandwiched between the anodes 103a and 103b and the cathodes 108a and 108b to have the optical axis L1 as the center. Hatched regions A where the anodes 103a to 103c and the cathodes 108a to 108c overlap function as light-emitting regions. That is, light-emitting regions A arranged in a matrix serve as display pixels of the display means 113.

Figure 6:
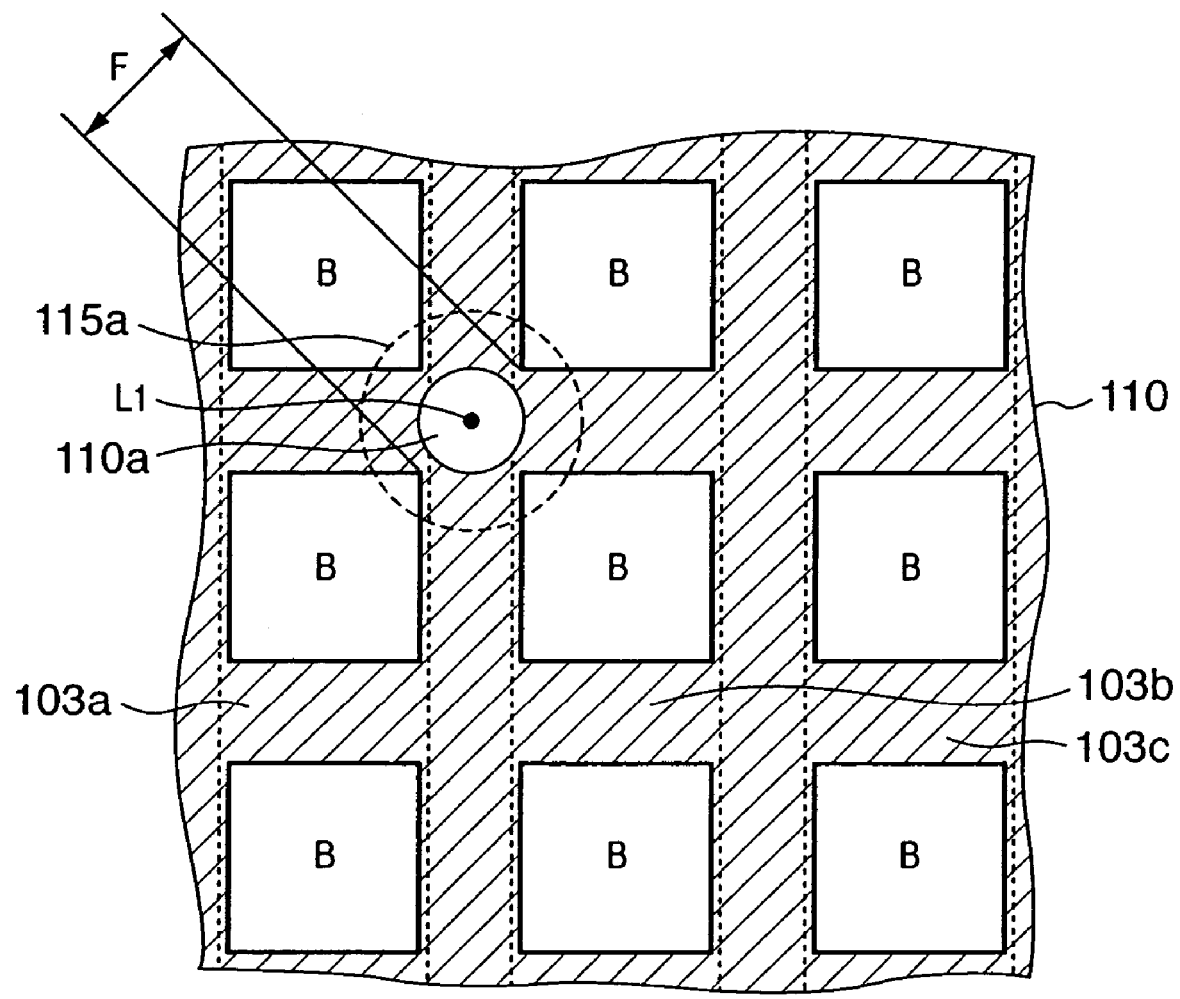
FIG. 6 is a plan view of the display means in FIG. 4 when viewed from the cathode side.

Likewise, FIG. 6 is a plan view of the display means 113 in FIG. 4 when viewed from the cathode 108 side. Note that FIG. 6 does not illustrate members other than the anodes 103 and black matrix 110. Regions corresponding to light-emitting regions A are formed on the black matrix 110 as opening regions B, and other regions are formed to shield light. The circular opening 110a is formed at a position which corresponds to the lens 115a indicated by the dotted circle and has the optical axis L1 as the center. Note that FIG. 4 is a horizontal sectional view of FIGS. 5 and 6.

The circular opening 110a is formed on the black matrix 110 at the position corresponding to the lens 105a using a region which is not required for display between light-emitting regions A. Therefore, display quality do not impair.

Each cathode 108 does not transmit any light since it is a metal film. In this embodiment, since the lens 115a and opening 110a are formed on a region where no metal film is present between the cathodes 108a and 108b, no opening need be formed on the metal film. However, if a light-shielding member such as a cathode or the like is present on this region, an opening must be formed as needed, and such member corresponds to a light-shielding member, needless to say. In this embodiment, the optical axis L1 of the lens 115a is located on a region where no metal film is present, so as to eliminate process complexity. Furthermore, since the opening 110a has a circular shape, it can have a large diameter when the optical axis L1 is set at the center of the four display pixels in this way. Therefore, the degree of freedom in design of an f-number can be improved.

As optical performance on the image sensing means 112 side, a light beam which passes through a region other than the opening 110a, for example, opening region B near the opening 110a may enter an object image formed by the lens 115a, and may deteriorate imaging performance as ghost and flare. In this embodiment, since the cathodes 108 formed of a metal film are present on opening regions B, such light beam is perfectly intercepted. However, the cathodes 108 are normally formed of a metal film with a high reflectance so as to efficiently output light emitted by the organic layer 114 toward the display surface side, and such material is more likely to cause ghost and flare. In this case, the black matrix 110 can be formed thick to completely divide the organic layer 114. Furthermore, a low-reflectance film is formed on the cathodes 108 on the replica layer 115 side and near the image sensing means 112 so as to minimize reflectance of light by the cathodes 108 on the replica layer 115 side. Note that the replica layer 115 side of the cathodes 108 does not relate to the amount of light for display, and such arrangement does not pose any problem.

Referring back to FIG. 4, an image sensing element package unit 119 which includes an image sensing element 116, circuit board 117, and cover glass 118 is arranged via an adhesive layer 120 at a position near the imaging position of the lens 115a. An infrared cut layer 121 is formed on the entrance surface side of the cover glass 118 by multilayered film coating, and intercepts infrared light that adversely influences image sensing.

Figure 7:
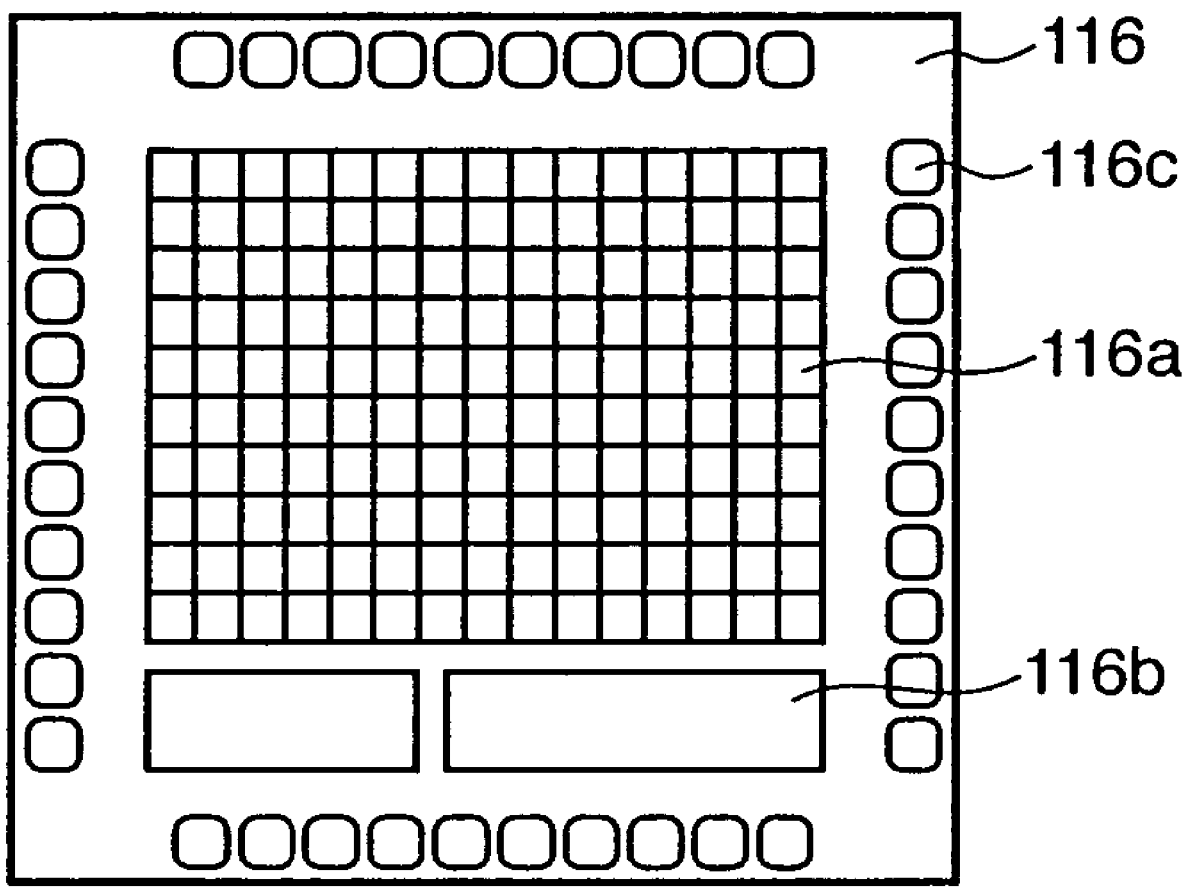
FIG. 7 is a plan view of an image sensing element when viewed from a lens side.

FIG. 7 is a plan view of the image sensing element 116 when viewed from the lens 115a side. A large number of light-receiving pixels 116a are formed in a matrix on the image sensing element 116, and photoelectrically convert an object image formed by the lens 115a. Each of the light-receiving pixels 116a comprises color filters (not shown) and a microlens (not shown), and can sense a color image using a known Bayer matrix as a color filter matrix. Reference numeral 116b denotes an on-chip peripheral circuit which includes a timing generator, A/D converter, and the like, and is formed on the image sensing element 116 integrally with the light-receiving pixels 116a. Furthermore, electrode pads 116c are formed in a ring pattern around these components. Gold bumps (not shown) are formed on the electrode pads 116c, and are electrically connected to electrode portions (not shown) of the circuit board 117 by an anisotropic conductive paste or thermal or ultrasonic bonding. A sensed image signal can be read out via the circuit board 117.

Figure 8:
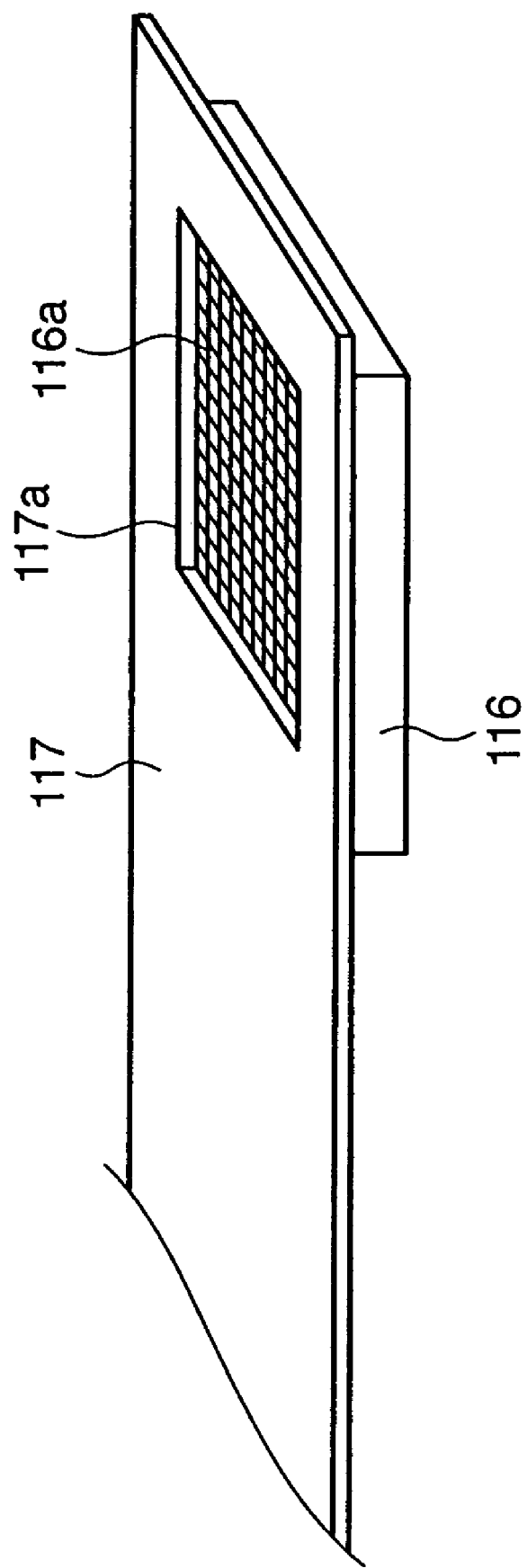
FIG. 8 is a perspective view of the image sensing element to which a circuit board is joined when viewed from obliquely above.

FIG. 8 is a perspective view of the image sensing element 116 to which the circuit board 117 is joined when they are viewed from obliquely above. An opening 117a is formed on the circuit board 117 to expose the light-receiving pixels 116a, so that they can photoelectrically convert an object image. The cover glass 118 is arranged via the opening 117a on the circuit board 117 on the side opposite to the image sensing element 116. Therefore, a small air layer is formed between the light-receiving pixels 116a of the image sensing element 116 and cover glass 118, so as to exhibit an optical effect by the microlenses formed on the light-receiving pixels 116a. Note that ultraviolet and thermo setting adhesive sealant layers are formed on the boundary surfaces of respective members to maintain a mechanical strength, and to assure a tight seal structure that seals the light-receiving surface of the image sensing element 116 from an external air together with the anisotropic conductive paste.

The detailed arrangement of such image sensing element package unit 119 is disclosed in Japanese Patent No. 3207319,and this embodiment adopts this image sensing element package. As a feature of this package, an image sensing device of a lower profile can be realized since the circuit board 117 used to output a sensed image signal is arranged between the light-receiving pixels 116a and lens 115, that is, in the optical path of the image sensing optical system.

The image sensing element package unit 119 is fixed by an adhesive layer 120 after it undergoes position adjustment such as tilt, rotation, and the like so that an object image formed by the lens 115a is formed on the light-receiving surface of the image sensing element 116.

As described above, the opening 110a,lens 115a, and image sensing element package unit 119 form the image sensing means 112. Lines indicated by C and D in FIG. 4 indicate light rays which are imaged at the end portion of the light-receiving region of the image sensing element 106, so that an object of a predetermined field angle can be sensed.

Figure 9:
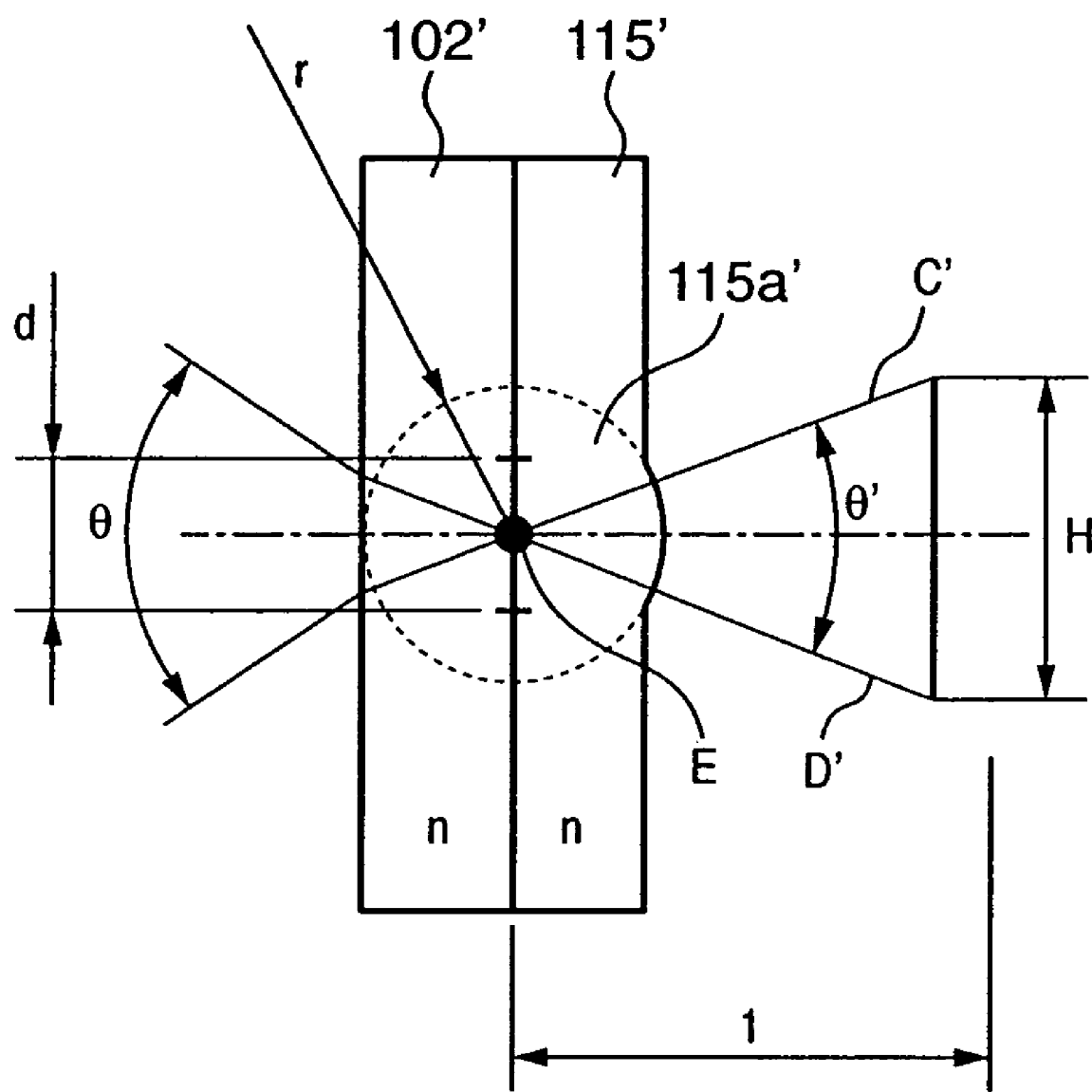
FIG. 9 shows a simple model of an optical system of image sensing means show in FIG. 4.

For example, the dimensions around the image sensing means 112 will be calculated. FIG. 9 shows a simple model of the optical system of the image sensing means 112 shown in FIG. 4, and calculations will be made using FIG. 9.

In FIG. 9, 102' corresponds to the transparent insulating substrate 102, and 115' corresponds to the replica layer 115. A spherical lens 115a corresponds to the lens 115a, and has a spherical surface for the sake of easy calculations. The spherical surface has a central point E on the boundary surface between 102' and 115' and has a radius r. Also, d is the diameter of an aperture stop of the spherical lens 115a' corresponding to the opening 110a,and the refractive indices of 102' and 115' are uniquely n. Furthermore, H is the diagonal dimension of a region where the light-receiving elements 116a of the image sensing element 116 are formed, and light rays C' and D' are those which are imaged at the end portion of H and pass through the central point E. Therefore, light rays C' and D' are refracted by only the entrance surface of 102', and are not refracted by other boundary surfaces.

In this way, by setting the weak power of the entrance surface and the strong power of the exit surface, that is, by arranging the stop at the center of the radius t of the spherical surface in a planoconvex optical system, the curvature of an image plane can be reduced. Note that an aspherical surface is formed in place of the spherical surface in practice to correct various aberrations such as curvature, chromatic aberration, and the like.

θ is the angle that the light rays C' and D' make, (i.e., the photographing field angle), and θ' is the photographing field angle after diffraction by the optical system.

Assuming that the image sensing element 116 has 320×240 pixels (QVGA size), and the pixel pitch is 0.003 mm, the diagonal dimension H is given by:

$$H = 0.003 \times \sqrt{(320^2 + 240^2)} = 1.20 \text{ mm} \quad (1)$$

The photographing field angle θ can be arbitrarily set. However, since the distance between the display device and user is relatively short in this embodiment, a wide angle is preferably set. Hence, if θ=60° and the refractive index n=1.5, according to the Snell's law, θ' is given by:

$$\theta' = 2 \times a\sin(\sin(\theta/2)/n) = 38.94° \quad (2)$$

Therefore, a distance 1 from the central point E to H is given by:

$$1 = (H/2)/\tan(\theta'/2) = 1.70 \text{ mm} \quad (3)$$

The transparent insulating substrate 102 normally has a thickness of 0.7 mm, and the image sensing element 116 also has a thickness of about 0.7 mm if it has a standard wafer size. Hence, the total thickness is about 3.10 mm.

On the other hand, let f be the focal length of the spherical lens 115a'. When the distance to the object position is sufficiently larger than the focal length and is approximated nearly by infinity, and the refractive index is n=1.5,f=2r and 1=3r. Hence, we have f=1.13 mm and r=0.57 mm. If the spherical lens 115a' has an f-number=f8.0,the aperture stop diameter d=0.14 mm.

Note that the simple model in FIG. 9 has been explained while ignoring the anodes 103, organic layer 114, and cathodes 108. Since these layers are formed of thin films, and their total thickness is as small as about several Mm, no problem is posed if they are ignored upon consideration. The lens 115a is considered as a spherical lens free from various aberrations, but no problem is posed upon calculating the approximate dimensions.

On the other hand, when the diagonal size of the display panel of the display means 113 is 15", the horizontal length=12" (304.8 mm) and the vertical length=9" (228.6 mm). If this display means is a VGA compatible display device having 640 x 480 display pixels, both the horizontal and vertical display pitches are 0.476 mm. If the opening ratio of each display pixel is 60%, the width of the black matrix 110 is calculated by:

Length of one side of opening:

$$\sqrt{(0.476^2 \times 0.6)} = 0.369 \text{ mm} \quad (4)$$

Black matrix width between neighboring display pixels:

$$0.476 - 0.369 = 0.107 \text{ mm} \quad (5)$$

Black matrix diagonal dimension among four display pixels:

$$0.107 \times \sqrt{2} = 0.152 \text{ mm} \quad (6)$$

This black matrix diagonal dimension corresponds to the dimension F in FIG. 6, and it is sufficiently possible to form the aperture stop diameter of 0.14 mm. When the aperture stop diameter is extremely stopped down, the contrast of the high-frequency range drops due to the influence of diffraction. This is because the intensity of diffraction fringes due to peripheral waves produced from the edge of the aperture stop increases. In order to reduce such diffraction fringes, a filter which has a transparent central portion and has a higher density toward its periphery can be added to the aperture stop portion. This method is called apodization, and such filter can be formed by depositing or sputtering a thin film of inconel, chromel, chromium, or the like.

As described above, by forming a hole having an aperture diameter as small as 0.14 mm in the black matrix 110, an ultra-low-profile display device with an image sensing device having a thickness of 3.10 mm can be realized.

FIG. 10 is a perspective view showing the outer appearance of the display device 111 with the image sensing device.

Reference numeral 130 denotes a display panel of the display means 113. The user observes information displayed on this display panel 130. As indicated by the dotted line in FIG. 10, the image sensing means 112 is embedded near the center of the display panel 130. Since the opening 110a of the image sensing means 112 is very small, it cannot be visually confirmed from the display panel 130 side, and is not shown in FIG. 10. Reference numeral 131 denotes a housing which supports the display device 111 with the image sensing device of this embodiment.

Figure 11:
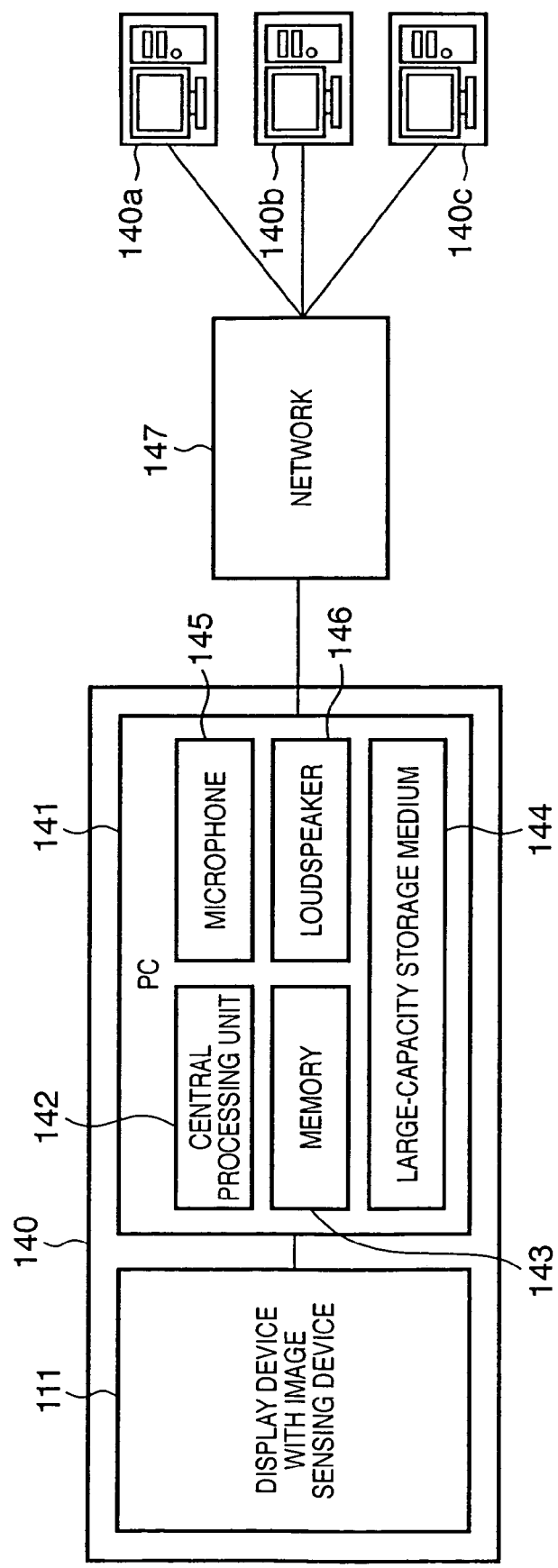
FIG. 11 is a block diagram showing a system that implements real-time two-way image communications.

FIG. 11 is a block diagram showing a system that implements real-time, two-way image communications using the display device 111 with the image sensing device of this embodiment. This embodiment will exemplify a case wherein the display device 111 with the image sensing device is connected to an information processing device 141 such as a PC (personal computer) or the like, and is controlled by that information processing device.

Reference numeral 140 denotes an information terminal which includes the display device 111 with the image sensing device. The information terminal 140 includes the display device 111 with the image sensing device and information processing device 141.

The information processing device 141 comprises a known arrangement, which is, a central processing unit 142, memory 143 and large-capacity storage medium 144 (e.g., a hard disk or the like). The large-capacity storage medium 144 stores an OS (operating system), which is used to boot the information processing device 141 by the program control. The large-capacity storage medium 144 stores application software that makes various kinds of operation control of the display device 111 with the image sensing device, and control operations such as image sensing start, communication start, and the like are made under the control of the OS. The information processing device 141 also comprises a microphone 145 and loudspeaker 146 used to make voice communications. Furthermore, a known mouse and keyboard (not shown) which form a user interface are also connected to the information processing device 141.

The information processing device 141 is connected to a network 147 via a public telephone line, LAN line, or the like. A plurality of information terminals 140a, 140b, and 140c are connected via the network 147.

With this arrangement, real-time, two-way image communications are implemented.

Figure 12:
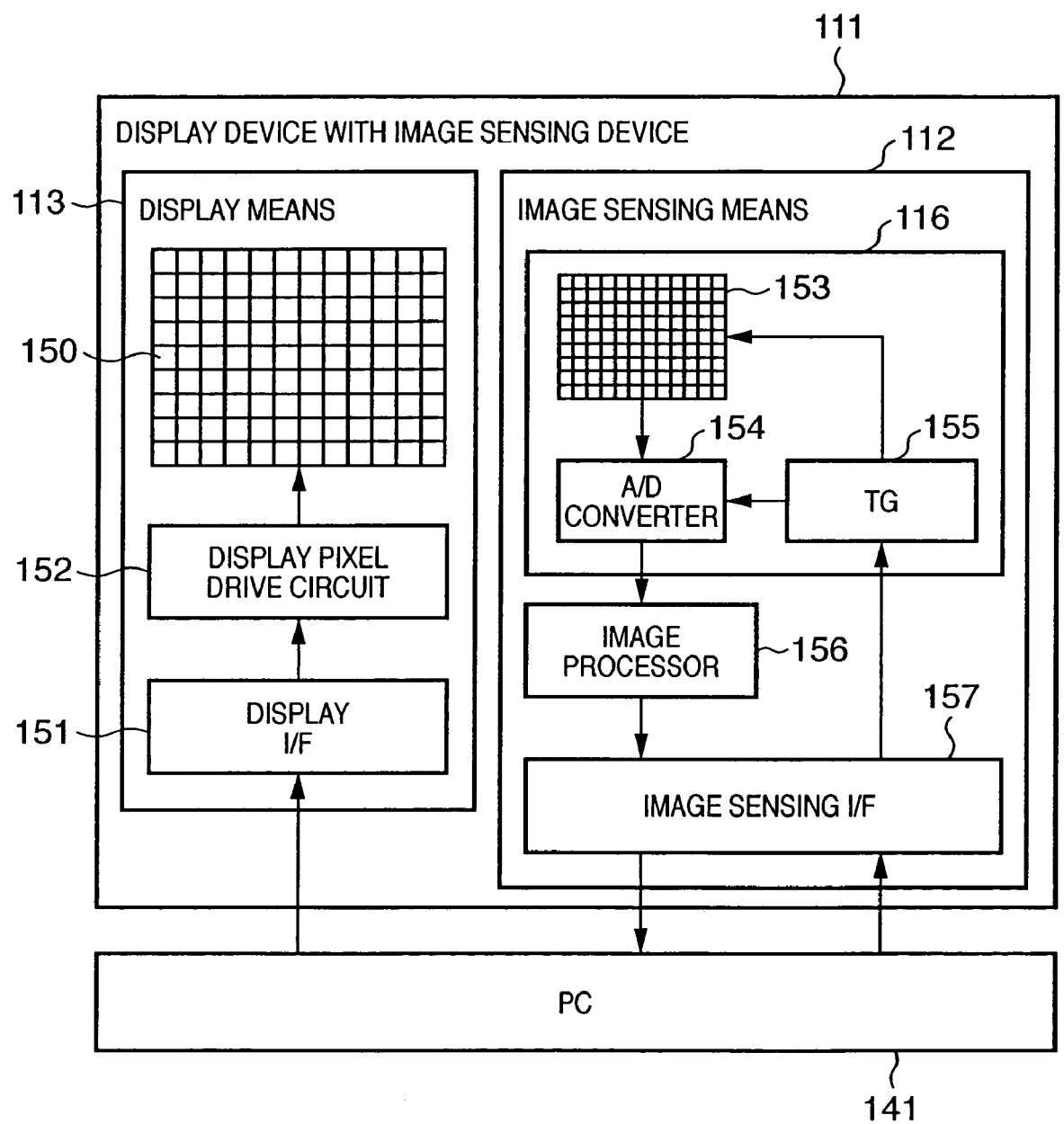
FIG. 12 is a block diagram showing the electrical arrangement of the display device with the image sensing device in more detail.

FIG. 12 is a block diagram showing the electrical arrangement of the display device 111 with the image sensing device in more detail.

The display device 111 with the image sensing device includes the display means 113 and image sensing means 112.

In the display means 113, reference numeral 150 denotes a display unit which comprises a large number of display pixels as light-emitting regions A in FIG. 4; and 151, a display I/F which receives a display signal from an externally connected device such as the information processing device 141 in FIG. 11 or the like. Reference numeral 152 denotes a display drive circuit which drives the large number of display pixels on the basis of the display signal sent via the display I/F 151.

In the image sensing means 112, the image sensing element 116 comprises a light-receiving region 153 including a large number of light-receiving pixels 116a shown in FIG. 7, and is integrally formed with an A/D converter 154 for converting analog signals photoelectrically converted by the respective light-receiving pixels 116a into digital signals, and a TG (timing generator) 155 for sending various timing signals to the A/D converter 154. Reference numeral 156 denotes an image processor which applies various image processes such as automatic exposure, gamma correction, white balance adjustment, filter operations, and the like to a digital image signal converted by the A/D converter, and generates an image format that can be mapped on the information processing device 141. Reference numeral 157 denotes an image sensing I/F which sends an image to the information processing device 141, and receives an image sensing timing signal from the information processing device 141.

Note that the display means 113 and image sensing means 112 are independently connected to the information processing device 141. This is because the connection interface between the display means and information processing device is specified by the standard, and a unique standard must be prepared if a specification for connecting a sensed image signal is added, resulting in poor versatility. Note that the image sensing means 112 can use a versatile connection format suited to transfer a moving image such as known USB, IEEE1394 connection, and the like.

Figure 13:
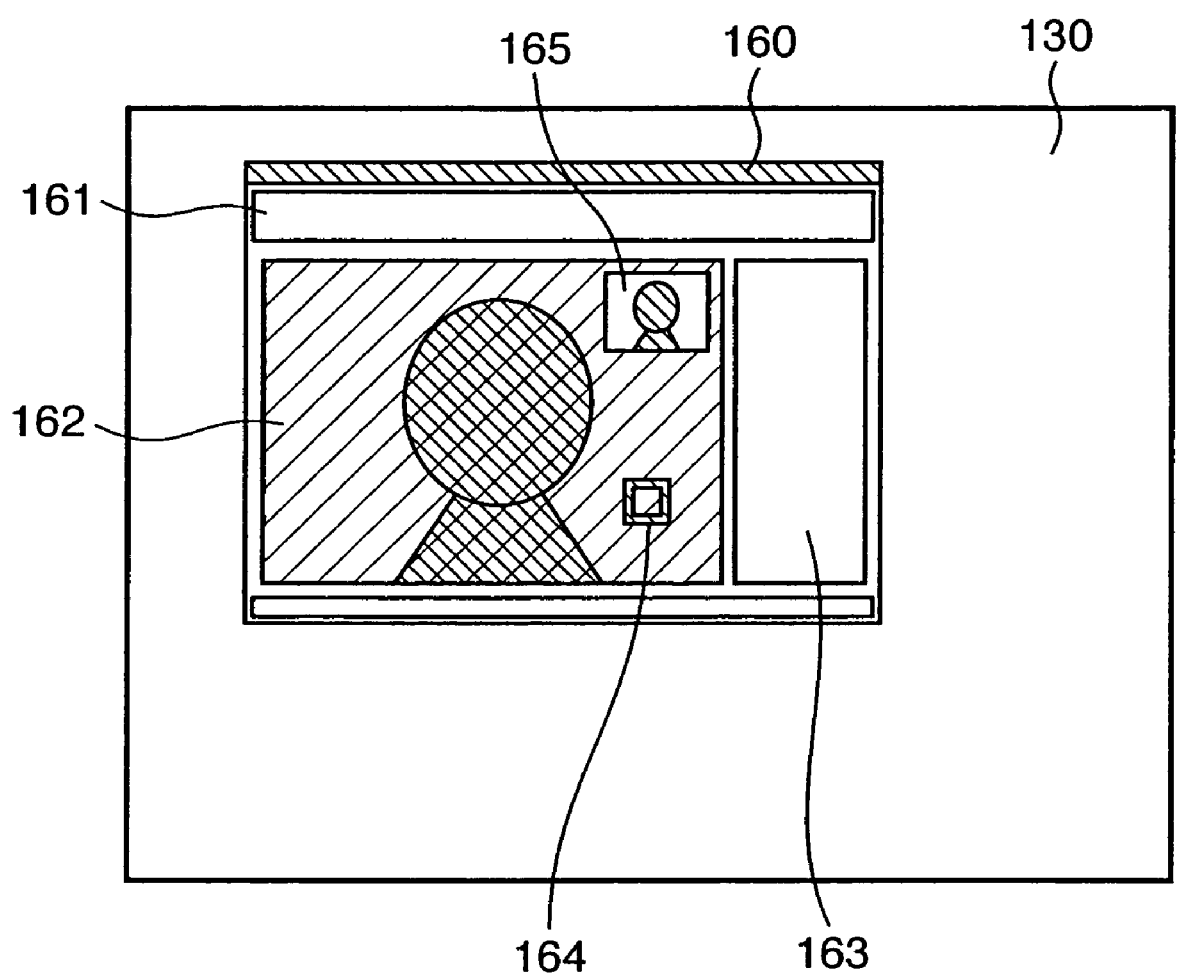
FIG. 13 is a schematic view showing a display state of application software on a display panel.

FIG. 13 is a schematic view showing a state wherein application software used to make two-way communications is displayed on the display panel 130 in FIG. 10. Note that the application software is stored in the large-capacity storage medium 144 of the information processing device 141, as described above, and is launched by a user's operation.

Referring to FIG. 13, reference numeral 160 denotes an application window, which comprises a command input field 161 including a plurality of command buttons that allow the user to make setups of various functions and operations, an image display window 162 (hatched portion in FIG. 13) used to display a sensed image and an image sent via communications, and an image sensing/communication command input field 163 on which a plurality of command buttons associated with image sensing operations and communications of those of the command input field 161 are extracted and arranged to allow the user to make easy and quick operations. Note that the user makes setups and operations on the command input field 161 and image sensing/communication command input field 163 using the known mouse and keyboard.

Reference numeral 164 denotes an image sensing means position mark indicating the location of the image sensing means 112. The user can arbitrarily turn on/off display of this image sensing means position mark on the command input field 161 and image sensing/communication command input field 163. Such mark has a role of informing the user of the position of the display panel 130 where he or she should gaze upon making an image sensing operation and two-way communications. This mark is effective when the opening diameter of the opening 110a is very small and cannot be visually confirmed like in this embodiment.

Furthermore, the application window 160 comprises a self image display window 165, and the user can confirm the way he or she looks.

Figure 14:
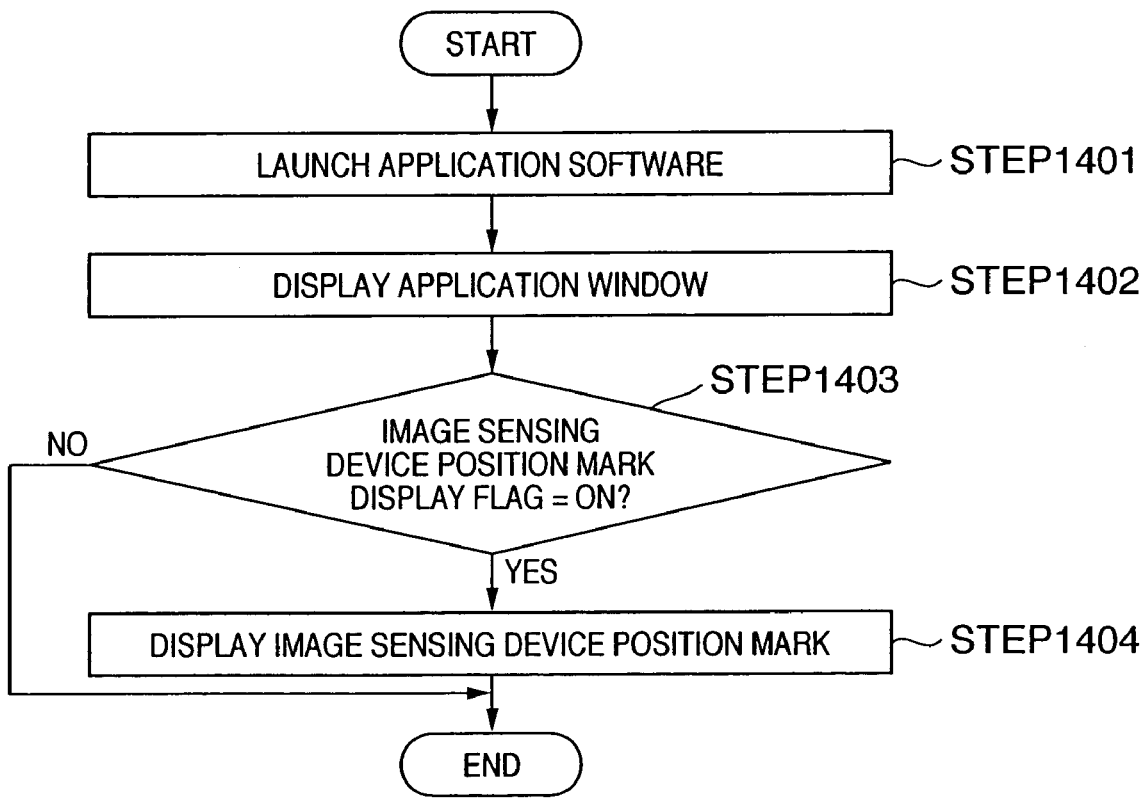
FIG. 14 is a flowchart showing the operation upon launching application software.

FIG. 14 is a flowchart showing the operation upon launching the aforementioned application software.

In STEP 1401, the application software is launched by a mouse operation or the like under the control of the OS of the information processing device 141.

In STEP 1402, the information processing device 141 sends a display signal to the display means 113, and the application window 160 is displayed on the display panel 130.

It is checked in STEP 1403 if an image sensing means position mark display flag is ON. Note that the image sensing means position mark display flag is the display ON/OFF setup of the image sensing means position mark 164, which can be arbitrarily set by the user, and the mark is displayed when the flag is ON. Upon quitting the application software, this flag status is saved, and is read out when the application software is launched next time.

If the image sensing means position mark display flag is ON, the flow advances to STEP 1404. In STEP 1404, the information processing device 141 sends a display signal to the display means 113 to display the image sensing means position mark 164 at the forefront in the display panel 130. Therefore, even when another application software is running, if the application software of this embodiment is active, the image sensing means position mark 164 is displayed at the forefront of the application window 160. Hence, the user can easily recognize the location of the image sensing means 112.

On the other hand, if the image sensing means position mark display flag is not ON, no image sensing means position mark 164 is displayed, and the application window 160 alone is displayed.

The operation upon launching the application has been described. Note that operations associated with an image sensing operation and communication are known to those who are skilled in the art, and a description thereof will be omitted.

With the above arrangement, real-time two-way image communications are implemented. The image sensing means 112 is equipped without projecting from the display device 112, and the opening 110a of the image sensing means 112 is formed without losing any display pixels. Also, the opening 110a has a very small opening diameter, and cannot be visually confirmed. Hence, display quality equivalent to a normal display device can be assured.

In this embodiment, the image sensing means 112 has no low-pass filter. A low-profile low-pass filter is very expensive, and if a thick filter is inserted, the feature of the low-profile-device is disturbed. Hence, no low-pass filter is adopted in this embodiment. However, a low-pass filter may be added. At this time, the cover glass 118 is preferably used as the low-pass filter.

As shown in FIG. 12, the image sensing means 112 comprises the image processor 156. However, in the display device connected to the information processing device 141 like in this embodiment, the application software may execute arithmetic processes of the image processor 156. In general, the central processing unit 142 of the information processing device 141 has very high processing performance, which is equivalent to or higher than that of the image processor 156 even when the image processor 156 is implemented by a hardware logic circuit. In this embodiment, the image sensing means 112 comprises the image processor 156 to provide versatility that allows use in mobile terminals with relatively low processing performance such as a notebook type PC, PDA, and the like. Therefore, it is relatively easy to connect the display device to general home electric appliances other than the information processing device 141. If application software cannot be installed in such electric appliance, operation buttons may be provided to, for example, the housing 131.

Furthermore, the display means 113 and image sensing means 112 are integrated, but their operation control processes are independent from each other. Therefore, the display and image sensing operations need not be synchronized. For example, even when the display means is OFF, only an image sensing function is used. In this way, the use range is broad; the device can be used as a monitor camera or the like.

Second Embodiment

The second embodiment is a modification of the first embodiment. In this embodiment, display pixels are arranged at higher density to improve the display resolution, and even when the opening ratio of each display pixel is increased, a relatively large aperture stop diameter can be assured.

Figure 15:
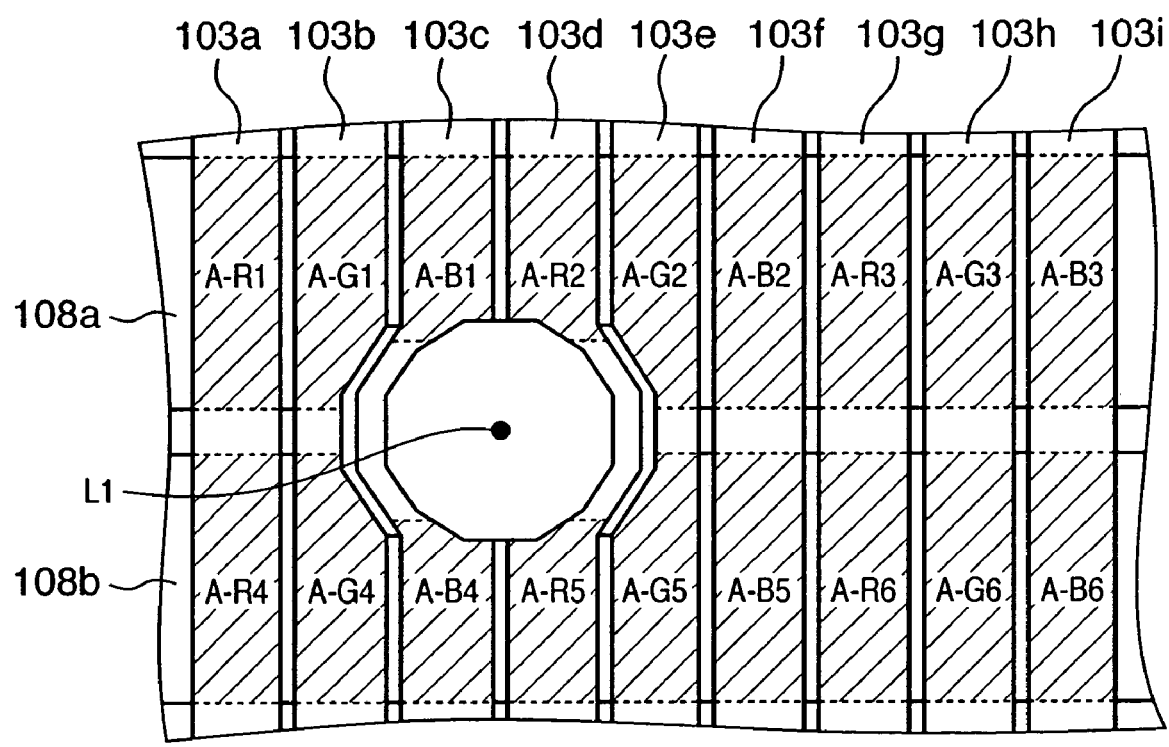
FIG. 15 is a plan view of display means according to the second embodiment when viewed from the anode side.
Figure 16:
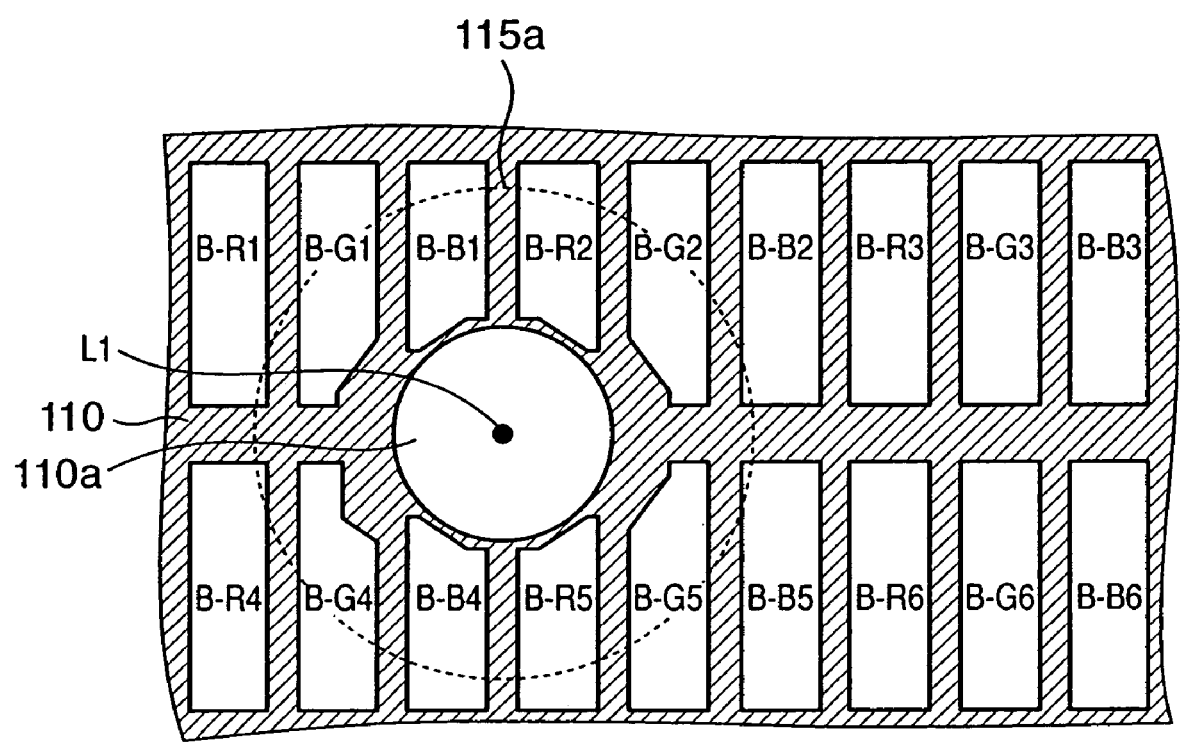
FIG. 16 is a plan view of the display means according to the second embodiment when viewed from the cathode side.

FIGS. 15 and 16 show an example of full-color display means which comprises image sensing means: FIG. 15 is a plan view of the display means 113 of the second embodiment when viewed from the anode 103 side, and FIG. 16 is a plan view of the display means 113 of the second embodiment when viewed from the cathode 108 side. FIGS. 15 and 16 respectively correspond to FIGS. 5 and 6 of the first embodiment. Note that FIG. 15 does not illustrate members other than the anodes 103 and cathodes 108, and FIG. 16 does not illustrate members other than the black matrix 110. Note that all of the five full-color methods described in the first embodiment can be applied to this embodiment.

Referring to FIG. 15, anodes 103a to 103i and cathodes 108a and 108b are arranged to be perpendicular to each other, and form vertically elongated light-emitting regions A-R1 to A-R6, A-G1 to A-G6, and A-B1 to A-B6 (hatched regions in FIG. 15). Of these symbols, R, G, and B indicate light-emitting regions which respectively emit light beams having red, green, and blue as dominant wavelengths, and numbers 1 to 6 indicate that three, R, G, and B regions with the same number form one pixel. Therefore, A-R1, A-G1, and A-B1 form one pixel by three, R, G, and B colors, and full-color display is expressed by arranging a large number of such pixels.

Vertically elongated opening regions-B-R1 to B-R6, B-G1 to B-G6, and B-B1 to B-B6 are formed on the black matrix 110 in correspondence with these light-emitting regions. Also, an opening 110a is formed among the opening regions B-B1, B-R2, B-B4, and B-R5. Reference numeral L1 denotes an optical axis of a lens 115a which agrees with the center of the opening 110a.

In order to form such opening 110a, the anodes 103c and 103d and cathodes 108a and 108b are wired to escape externally so as to have the optical axis L1 as the center, and the areas of some light-emitting regions decrease accordingly. Likewise, the areas of some opening regions of the black matrix 110 decrease. That is, some display pixels are notched.

However, the opening 110a with a large opening diameter can be formed in this way, and it is possible to form the opening 110a even when the light-emitting regions are densely arranged to improve the display resolution. As for display pixels near the opening 110a, the opening ratio decreases slightly. However, since display pixels are not completely lost, the influence on display is very small. For the display pixels whose opening ratio decreases, their light-emitting amounts can be electrically corrected to improve the display quality. In this embodiment, since a decrease in opening ratio is small, and the influence on display is negligible, no such correction is made.

For example, the size of the opening 110a in the full-color display device will be calculated.

When the diagonal size of the display panel 130 is 15", the horizontal length=12" (304.8 mm) and the vertical length=9" (228.6 mm). If this display means is an XGA compatible display device having 1024×768 display pixels, both the horizontal and vertical display pitches are 0.298 mm. Since one display pixel is formed of three, R, G, and B light-emitting regions, one light-emitting region pitch is equal to the display pitch in the vertical direction, but it is 0.099 mm in the horizontal direction. Referring back to FIG. 15, the opening 110a is formed to have a dimension about twice the light-emitting region pitch. If the dimension of the opening 110a is twice the light-emitting region pitch, the opening diameter of the opening 110a is 0.198 mm.

When the sensed image size is 320×240 pixels and the photographing field angle is 60° like in the first embodiment, the focal length is f=1.13 mm. However, when the opening diameter is 0.198 mm, as described above, an f-number at that time is f5.71,and an increase in light amount by about one level can be realized by the opening diameter.

As described above, by notching some display pixels, a larger opening 110a can be formed. Even in, for example, an XGA type display device which has a high resolution and in which light-emitting regions are arranged densely, a lower f-number can be assured.

Third Embodiment

The third embodiment will exemplify a case wherein a high-resolution sensed image can be obtained using an image sensing device which performs pixel shift by a multi-eye optical system without increasing the thickness of the overall device.

As an image sensing device which performs pixel-shift image sensing by a multi-eye optical system, an image sensing device disclosed in Japanese Patent Laid-Open No. 2002-209226 is known. This image sensing device forms four object images by four lenses, and senses these images by four image sensing regions. At this time, the four image sensing regions sample positions which are respectively shifted by ½ pixels, perform pixel-shift image sensing. The four image sensing regions sample object images of different wavelength ranges, and when these images are composited, an image equivalent to a known Bayer matrix can be obtained. This embodiment uses this image sensing device as the image sensing means 112.

Figure 17:
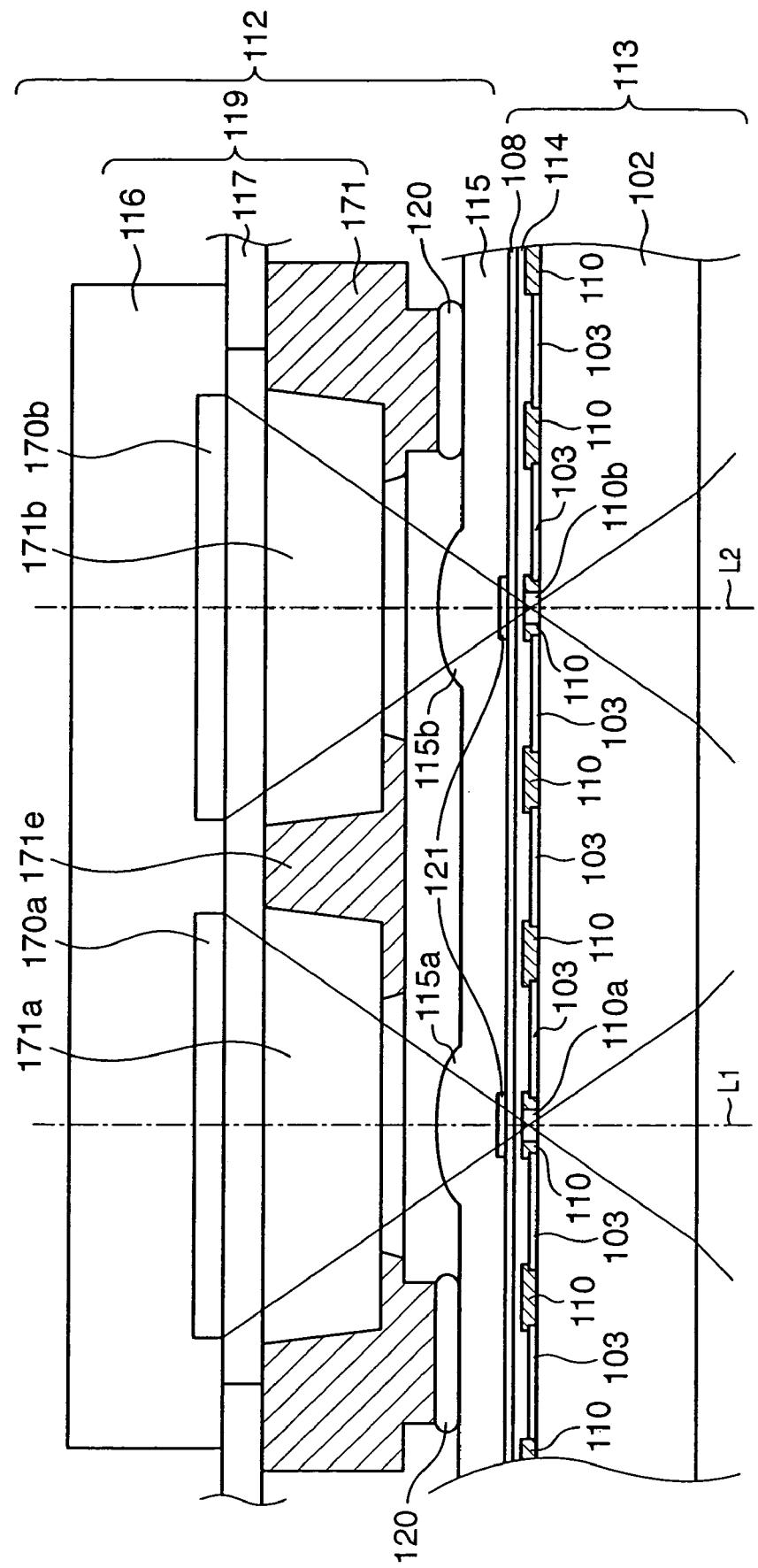
FIG. 17 is a partially enlarged, schematic sectional view of a display device with an image sensing device according to the third embodiment.

FIG. 17 is a partially enlarged, schematic sectional view of such display device with an image sensing device.

The image sensing means 112 comprises four lenses and image sensing regions, as described above, and the sectional view of FIG. 17 illustrates two of them. In FIG. 17, two openings 110a and 110b are formed on a black matrix 110. Two lenses 115a and 115b are formed in correspondence with the two openings 110a and 110b, and respectively have optical axes L1 and L2. An image sensing element 116 which comprises two image sensing regions 170a and 170b is arranged near the imaging positions of the two lenses 115a and 115b. A circuit board 117 is connected to the image sensing element 116 as in the first embodiment. Furthermore, a spacer 171 is provided on the circuit board 117 on the side opposing the image sensing element 116. Holes 171a and 171b are formed on the spacer 171 to guide light beams imaged by the lenses 115a and 115b toward the image sensing regions 170a and 170b. The contact surfaces of the circuit board 117 and spacer 171 are fixed by an adhesive sealant layer (not shown). The spacer 171 is formed with holes in correspondence with the lenses, and has a partition wall 171e to partition the light beam passage spaces of these holes. This is to prevent, for example, light rays, which pass through the opening 110a and lens 115a and fall outside the photographing field angle, from entering the neighboring image sensing region 170b (i.e., to prevent any optical crosstalk). The image sensing element 116, circuit board 117, and spacer 171 form an image sensing package unit 119. The image sensing package unit 119 is adhered and fixed to the display means 113 via an adhesive layer 120.

Figure 18:
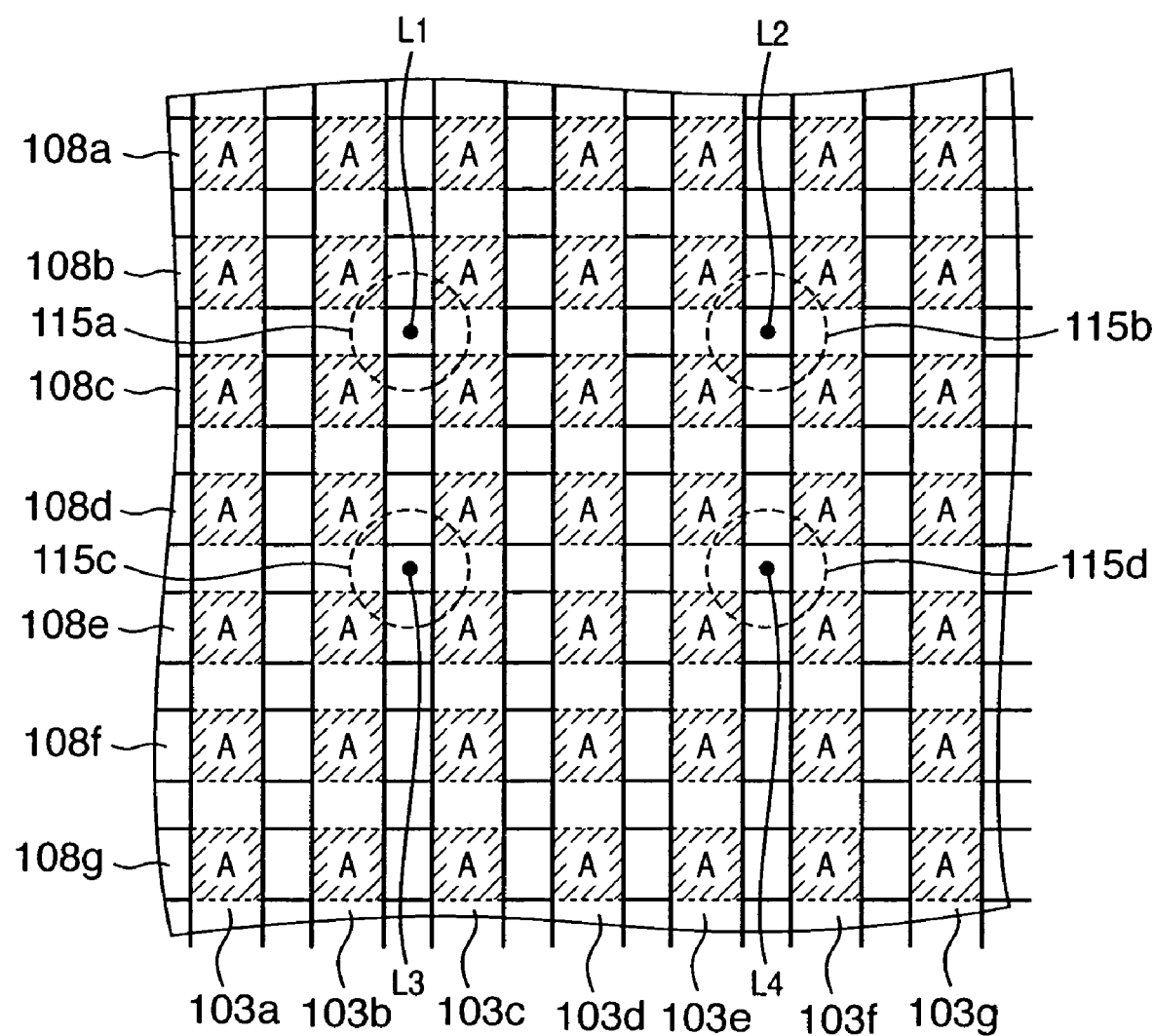
FIG. 18 is a plan view of display means in FIG. 17 when viewed from the anode side.

FIG. 18 is a plan view of the display means 113 in FIG. 17 when viewed from the anode 103 side. Note that FIG. 18 illustrates members other than the anodes 103 and cathodes 108. In FIG. 18, the dotted circles indicate the lenses 115a, 115b, 115c, and 115d, which are formed on regions, each of which is sandwiched between the two anodes and two cathodes, to have the optical axes L1, L2, L3, and L4 as their centers. As can be seen from FIG. 18, FIG. 17 is a horizontal sectional view that pass through the optical axes L1 and L2. Hatched regions A where the anodes 103a to 103g and cathodes 108a to 108g overlap serve as light-emitting regions.

Figure 19:
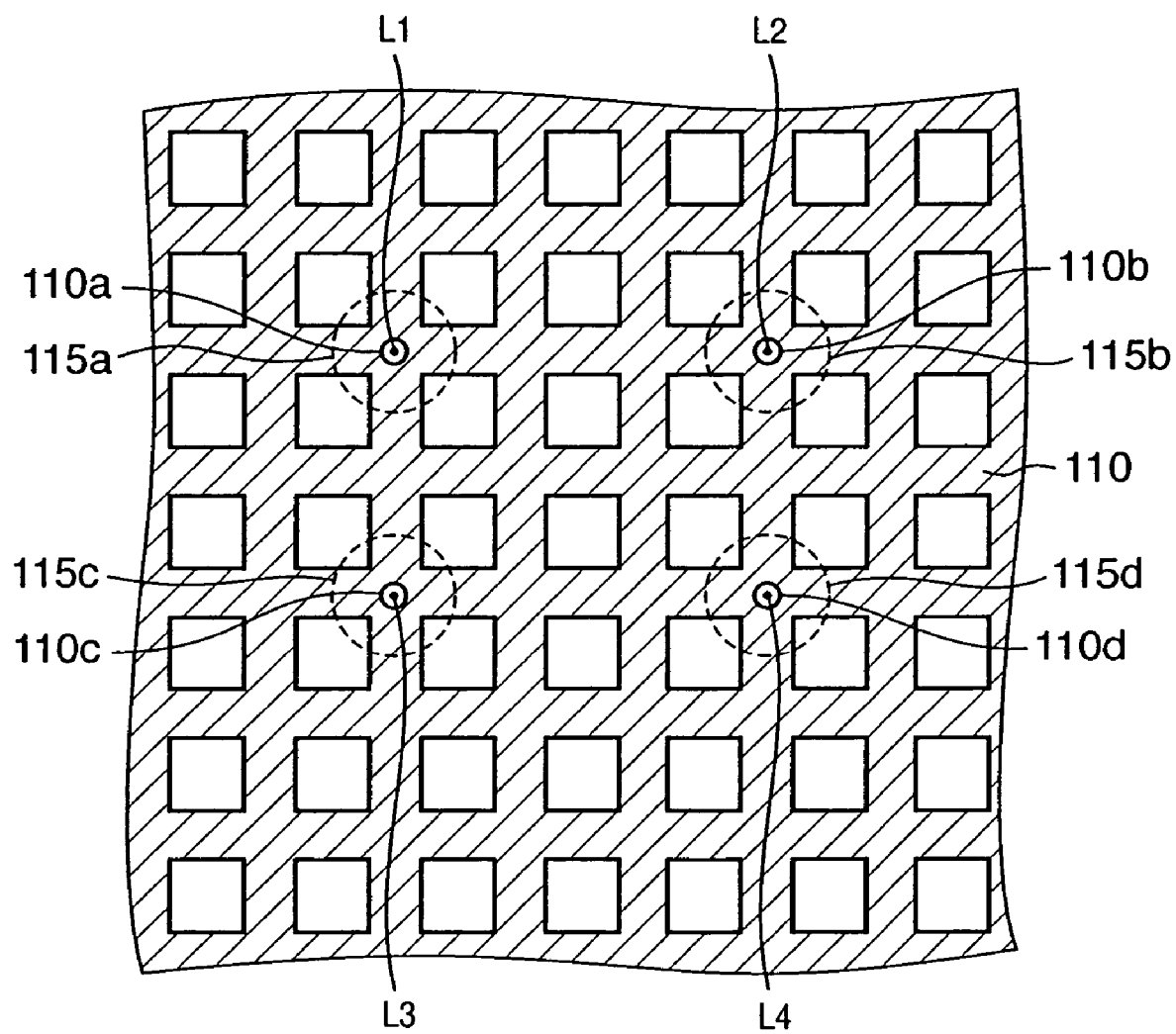
FIG. 19 is a plan view of the display means in FIG. 17 when viewed from the cathode side.

Likewise, FIG. 19 is a plan view of the display means 113 in FIG. 17 when viewed from the cathode 108 side. Note that FIG. 19 does not illustrate members other than the anodes 103 and black matrix 110. Regions corresponding to light-emitting regions A are formed on the black matrix 110 as opening regions B, and other regions are formed to shield light. Circular openings 110a, 110b,110c,and 110d are formed on the black matrix 110 at positions which correspond to the lenses 115a to 115d indicated by the dotted circles and have the optical axes L1 to L4 as the centers.

In this manner, the circular openings 110a to 110d are formed on the black matrix 110 at the positions corresponding to the lenses 105a to 105d using regions which are not required for display among light-emitting regions A. Therefore, the openings 110a to 110d for image sensing can be formed without deteriorating the display quality.

Figure 20:
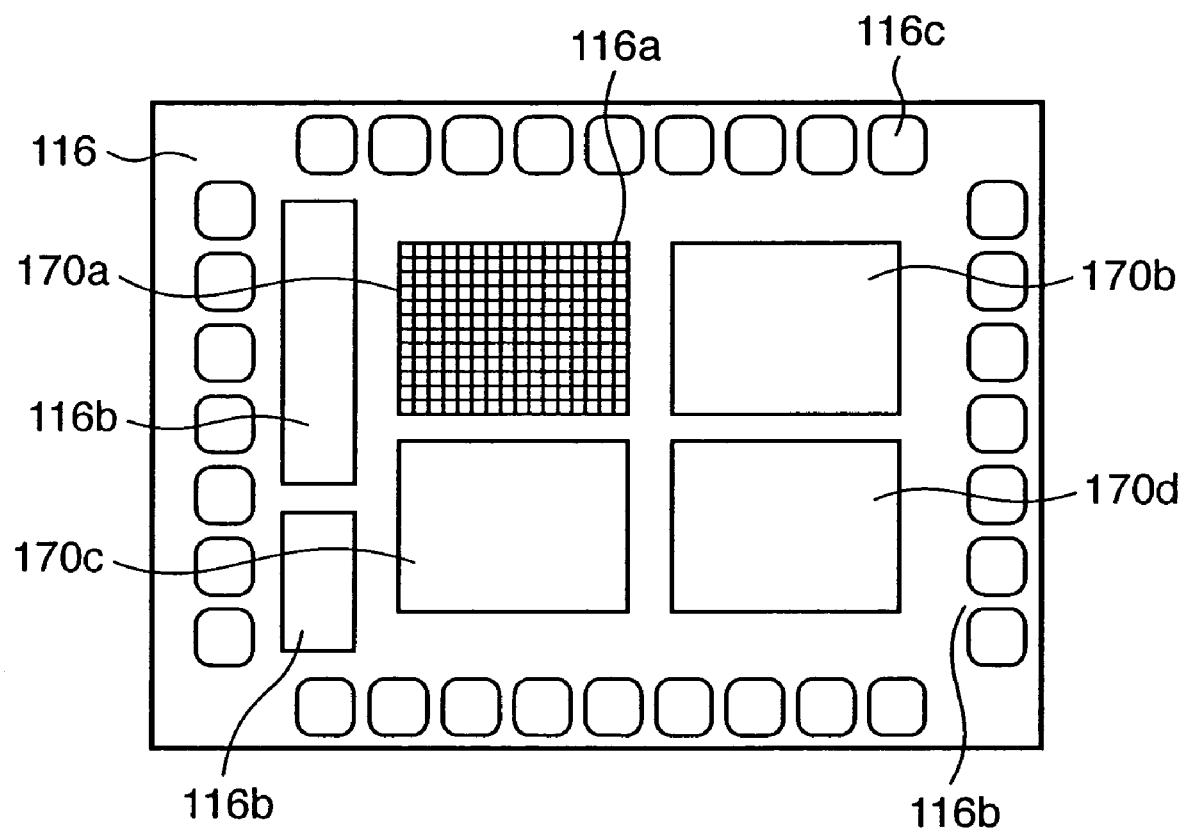
FIG. 20 is a plan view of an image sensing element in the third embodiment when viewed from the display means side.

FIG. 20 is a plan view of the image sensing element 116 when viewed from the display means 113 side. Four image sensing regions 170a, 170b, 170c, and 170d are formed on the image sensing element 116 in correspondence with the lenses 105a to 105d. A large number of light-receiving pixels 116a are formed in a matrix on the image sensing region 170a, and photoelectrically convert an object image formed by the lens 115a. Each of the light-receiving pixels 116a comprises color filters (not shown) and a microlens (not shown). Note that other image sensing regions 170b to 170d have the same arrangement, but light-receiving pixels 116a are not shown.

Reference numeral 116b denotes an on-chip peripheral circuit which includes a TG, A/D converter, and the like; and 116c, electrode pads used to electrically join the circuit board 117.

Note that the image sensing package unit 119 does not comprise any cover glass 118 unlike in the first embodiment. However, only the spacer 171 replaces the cover glass 118, and an electrical connection method and the like are the same as those in the first embodiment.

The image sensing element 116 of this embodiment comprises color filters for respective colors in correspondence with the image sensing regions 170a to 170d . For example, the regions 170a and 170d comprise green (G) color filters, the region 170b comprises a blue (B) color filter, and the region 170c comprises a red (R) color filter. The spacings of the optical axes L1 to L4 of the lenses 115a to 115d are set so that they intersect the image sensing regions 170a to 170d at positions shifted inwardly by ¼ pixels from the central positions of the respective image regions at a specific object distance. More specifically, this arrangement is equivalent to ½ pixel shift attained at that specific object distance.

Upon reading out image signals, image signals are alternately read out from the image sensing region 170c (R signals) and image sensing region 170d (G signals) to have the lower left pixel as the first pixel, and all signals for one horizontal line are read out. Likewise, image signals are alternately read out from the image sensing region 170a (G signals) and image sensing region 170b (B signals) to have the lower left pixel as the first pixel, and all signals for one horizontal line are read out. By repeating this process, image signals are read out from all the pixels. As a result, image signals of a known Bayer matrix can be obtained.

At this time, if the number of pixels in each of the image sensing regions 170a to 170d is 320×240 pixels (QVGA size) like in the first embodiment, the focal length of each of the lenses 115a to 115d is equivalent to that in the first embodiment. However, by compositing the image signals from the four image sensing regions 170*a* to 170*d*, a VGA image having 640×480 pixels, which are four times those in the first embodiment, can be obtained. Normally, in order to quadruple the number of pixels, the focal length of a lens must be doubled. However, with the above method, the focal length need not be prolonged. Furthermore, since the lenses 115*a* to 115*d* form object images for respective colors, nearly no chromatic aberration is contained. Also, the respective pixels of the image sensing regions 170*a* to 170*d* need not comprise any optical low-pass filters since apparent light-receiving portions due to a microlens effect overlap each other upon sampling object images by pixel shift. Therefore, according to this method, an image with a higher resolution can be obtained without increasing the thickness of the image sensing means 112.

Note that details are disclosed in Japanese Patent Laid-Open No. 2002-209226, and a description thereof will be omitted.

Figure 21:
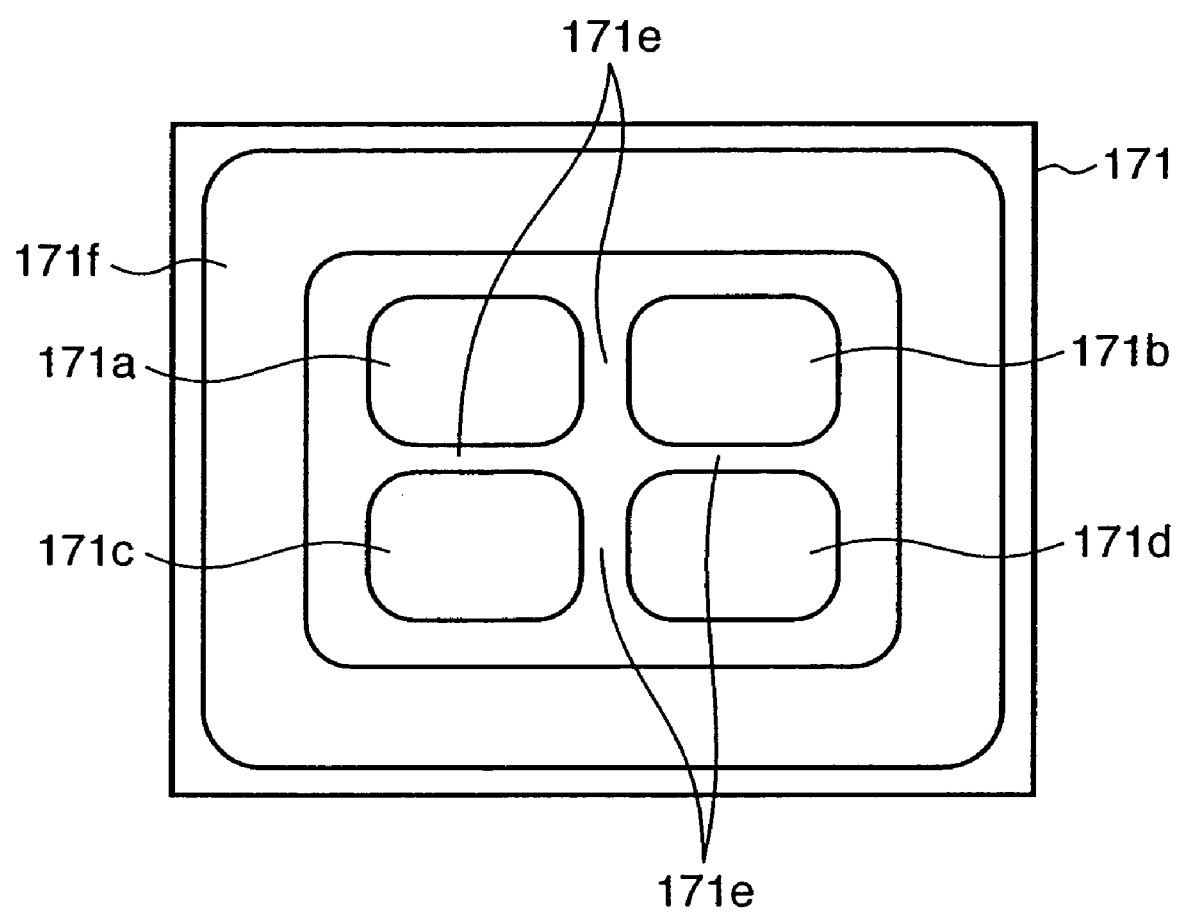
FIG. 21 is a plan view of a spacer when viewed from the display means side.

FIG. 21 is a plan view of the spacer 171 when viewed from the display means 113 side. The spacer 171 has the holes 171*a*, 171*b*, 171*c*, and 171*d* corresponding to the image sensing regions 170*a* to 170*d*, and can guide object images formed by the lenses 115*a* to 115*d* onto the image sensing element 116. These holes 171*a* to 171*d* form the partition wall 171*e*, which can prevent light from leaking into neighboring image sensing regions, i.e., optical crosstalk. Reference numeral 171*f* denotes a bank portion which is used to form the adhesive layer 120, and has an annular shape that surrounds the holes 171*a* to 171*d*. Therefore, the adhesive layer 120 is formed along this bank portion 171*f*. The bank portion 171*f* has a shape that projects toward the front side compared to other portions of the spacer 171 in FIG. 21, and has an effect of suppressing the adhesive 120 from protruding to regions other than the bank portion 171*f*. The image sensing regions 170*a* to 170*d* have a packaging structure which is tightly sealed by adhesive sealant layers between the image sensing element 116 and circuit board 117 and between the circuit board 117 and spacer 171, and the adhesive layer 120.

Figure 22:
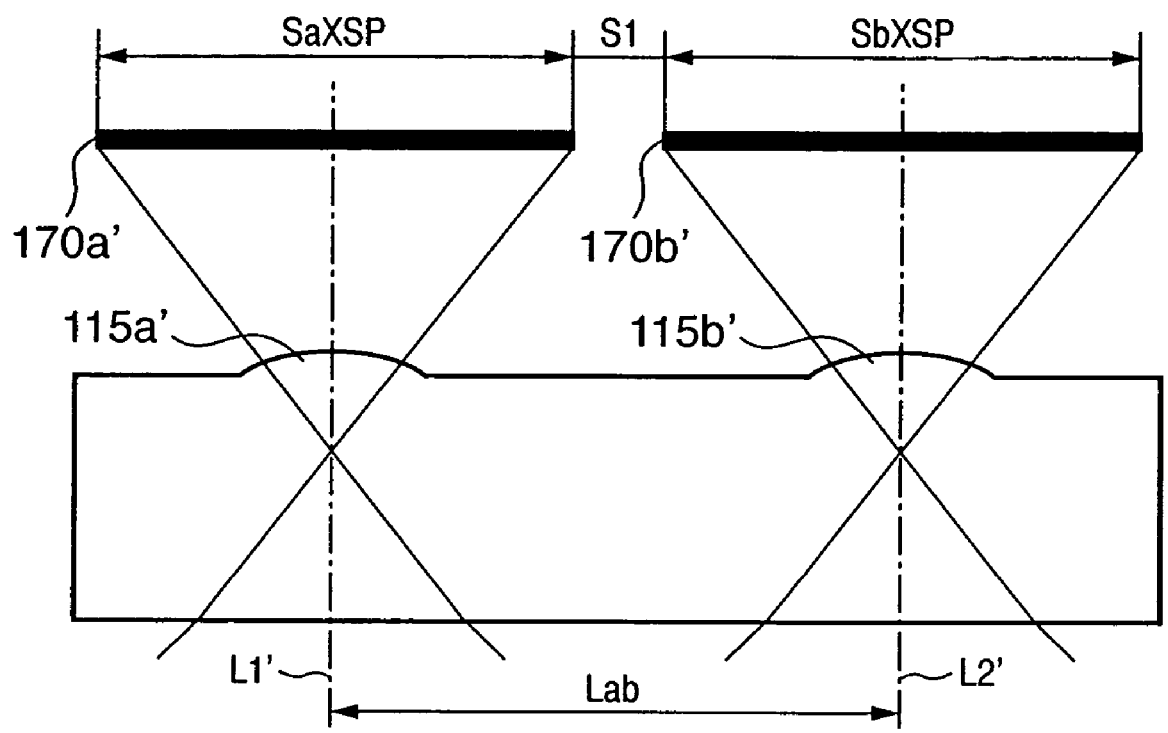
FIG. 22 shows a simple model around an optical system shown in FIG. 16.

For example, the spacing between the optical axes L1 and L2 will be calculated. FIG. 22 shows a simple model around the optical axis of FIG. 17. In FIG. 22, members with dashes "'" respectively correspond to those with the same reference numerals without dashes. As shown in FIG. 22, let Lab be the spacing between optical axes L1' and L2' of lenses 115*a*' and 115*b*', Sa and Sb be the numbers of pixels of image sensing regions 170*a*' and 170*b*' in the horizontal direction, S1 be the dimension between the image sensing regions 170*a*' and 170*b*', and SP be the pixel pitch. Then, in order to attain pixel shift, we have:

$$Lab = SP \times \{(Sa/2) + (Sb/2) - 0.5\} + S1 - \Delta L \quad (7)$$

where ΔL is the spacing correction amount required to apply pixel shift to an object at a finite distance. If an object is located at infinity, ΔL=0.

As has been explained in the first and second embodiments, the openings 110*a* and 110*b* can have larger opening diameters when they are formed at the center of four display pixels. Hence, in this embodiment, the four openings 110*a* to 110*d* are formed at such positions. Let DP be the display pixel pitch of the display means 113. Therefore, Lab can also be given by:

$$Lab = n \times DP \ (n \text{ is a positive integer}) \quad (8)$$

Assume that the number of pixels of one image sensing region is 320×240 pixels (QVGA size), the pixel pitch is SP=0.003 mm, and the display pixel pitch DP=0.476 mm as in the first embodiment. When an appropriate numerical value is substituted in n of equation (8), S1 assumes a positive value in equation (7) when n≧3. If S1 assumes a negative value, it graphically indicates a state wherein the image sensing regions 170*a*' and 170*b*' in FIG. 22 interfere with each other, and cannot be laid out. In this embodiment, the image sensing regions 170*a*' to 170*d*' are formed on a single chip to attain a cost reduction. In order to reduce the chip size, n is preferably as small as possible. Since a change in disparity depending on the distance becomes large as Lab increases, and a change in disparity is to be minimized within a photographable object distance range, n is preferably small. Therefore, if n=3, Lab=1.429 mm and S1=0.470 mm (for ΔL=0).

The above calculations have been explained in the horizontal section, but the same applies to the vertical direction. In case of the vertical direction, since Sa and Sb are smaller than those in the horizontal direction, Lab=0.953 mm and S1=0.234 mm when n=2.

As described above, a high-resolution image can be obtained by applying the pixel shift technique using the four imaging optical systems without increasing the total thickness of the device. Also, since the optical axes of the imaging optical systems are set in correspondence with the display pixel pitch to form openings, object images with a lower f-number can be obtained.

Fourth Embodiment

The fourth embodiment will exemplify a case wherein an active matrix organic EL display device is used as the display means.

In the active matrix system, pixel drive elements (active elements) are provided to pixels arranged in a matrix, and serve as switches which are turned on/off in response to scan signals. A data signal (display signal, video signal) is transmitted to the anode of an organic EL element via an ON pixel drive element, and is written in the organic EL element, thus driving the organic EL element. After that, when the pixel drive element is turned off, the data signal applied to the anode of the organic EL element is held as a charge in the organic EL element to continuously drive the organic EL element until the pixel drive element is turned on next time. For this reason, even when the number of scan lines increases and the drive time that can be assigned per pixel becomes short, it does not influence driving of the organic EL element, and the contrast of an image displayed on a display panel never drops. Therefore, according to the active matrix system, display with higher image quality than the simple matrix system can be attained.

The active matrix system is roughly classified into a transistor type (3 terminal type) and diode type (2 terminal type). The transistor type requires harder manufacturing processes than the diode type, but can easily attain high contrast and resolution, and can realize a high-quality organic EL display device comparable to a CRT. The above description of the operation principle of the active matrix system mainly corresponds to the transistor type.

Figure 23:
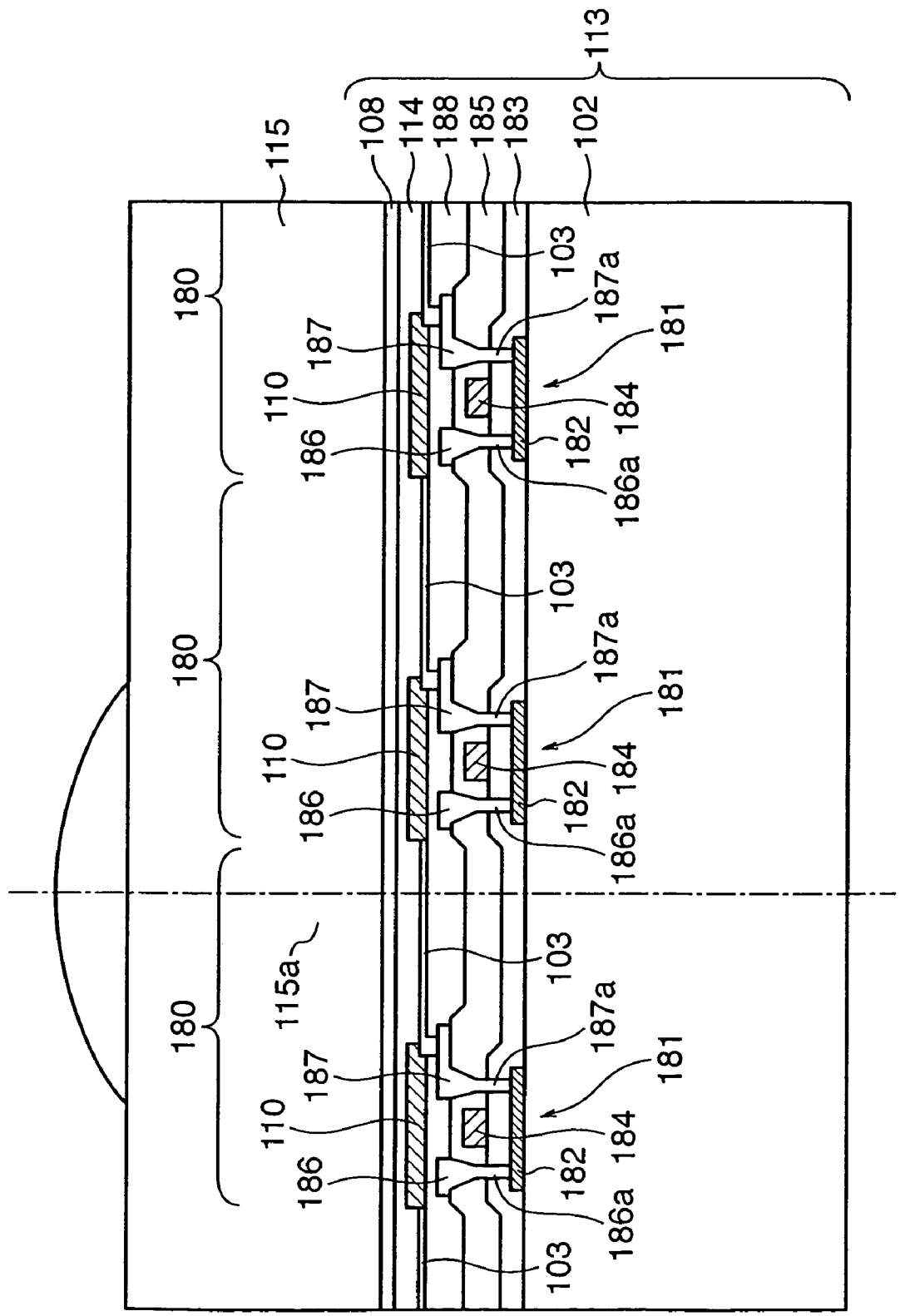
FIG. 23 is a partially enlarged, schematic sectional view of a display device with an image sensing device according to the fourth embodiment.
Figure 24:
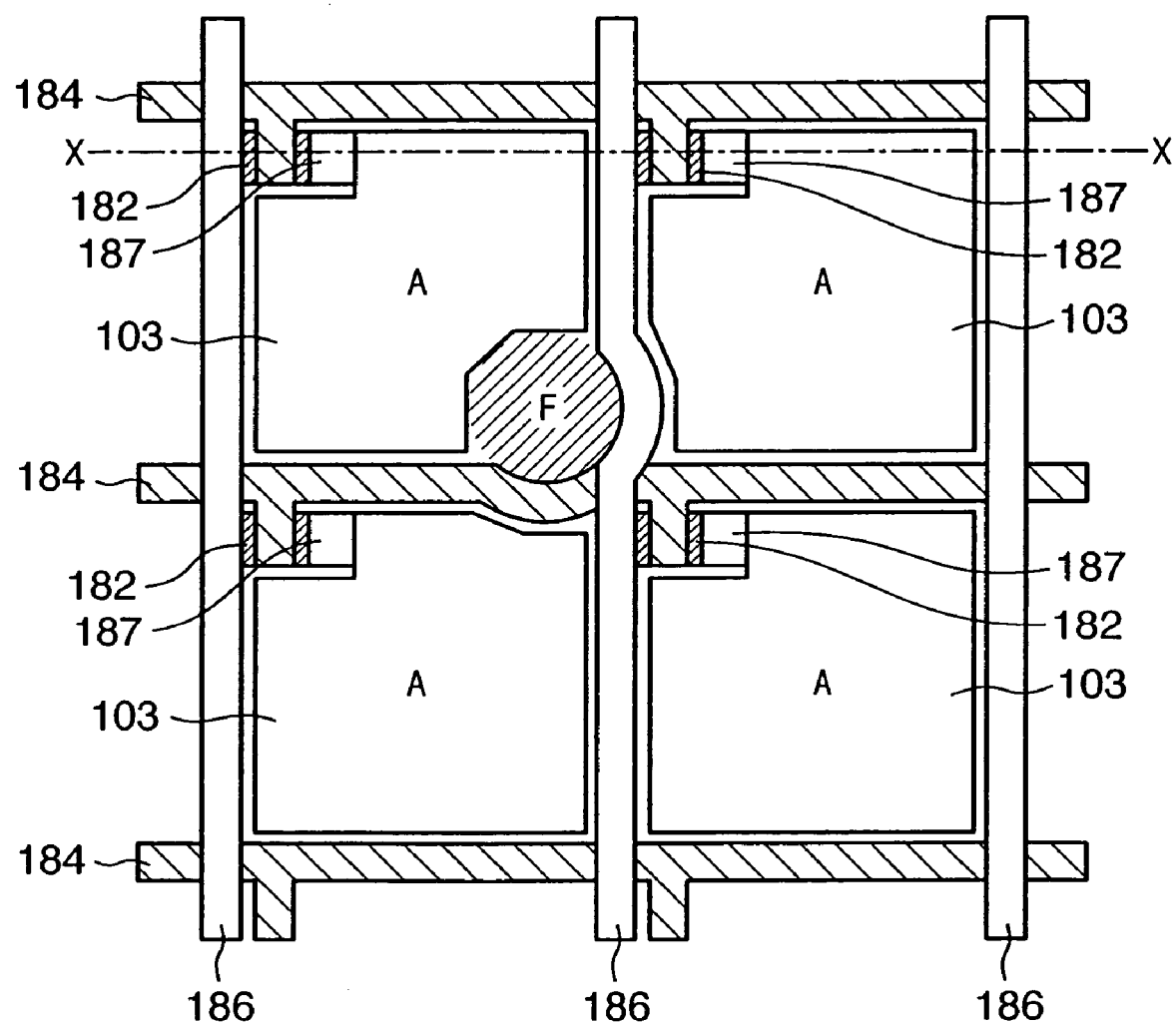
FIG. 24 is a plan view of principal members in FIG. 23 when viewed from the top surface side.

FIG. 23 is a partially enlarged, schematic sectional view of a display device with an image sensing device, and FIG. 24 is a plan view of principal members in FIG. 23 when viewed from the top surface side. FIG. 23 is a sectional view taken along a one-dashed chain line X-X in FIG. 24.

Each display pixel 180 has a thin film transistor (TFT) 181 which serves as a pixel drive element. A planar TFT 181 uses a polysilicon film 182 as an active layer, and adopts an LDD (Lightly Doped Drain) structure. The polysilicon film 182 is formed on a transparent insulating substrate 102. A gate electrode 184 is formed on the polysilicon film 182 via a gate insulating film 183. Each polysilicon film 182 includes a high-concentration source region, low-concentration source region, low-concentration drain region, and high-concentration drain region in turn from the left side.

An interlayer insulation film 185 is formed on the TFTs 181. The high-concentration source region is connected to a source electrode 186 via a contact hole 186a formed in the interlayer insulation film 185. The high-concentration drain region is connected to a drain electrode 187 via a contact hole 187a formed in the interlayer insulation film 185.

A planarizing insulating film 188 is formed on the electrodes 186 and 187 and interlayer insulation film 185. Each drain electrode 187 is connected to an anode 103 via a contact hole 189a formed in the planarizing insulating film 188. A black matrix 110 is formed on the planarizing insulating film 188 which is exposed from gaps between neighboring anodes 103. That is, the black matrix 110 is formed to be embedded between neighboring anodes 103. The black matrix 110 is arranged to cover each polysilicon film 182.

As shown in FIG. 24, a hatched region F required to form an opening of a lens must be assured near the center of the four display pixels 180. Therefore, the gate electrode 184 and source electrode 186 are wired to avoid this region F, and the anode 103 of the upper left display pixel 180 is notched. In the laminated structure of region F, the gate insulating film 183, interlayer insulation film 185, and planarizing insulating film 188 are laminated in turn from the transparent insulating substrate 102 side, and these members have high transmittance of visible light.

Figure 25:
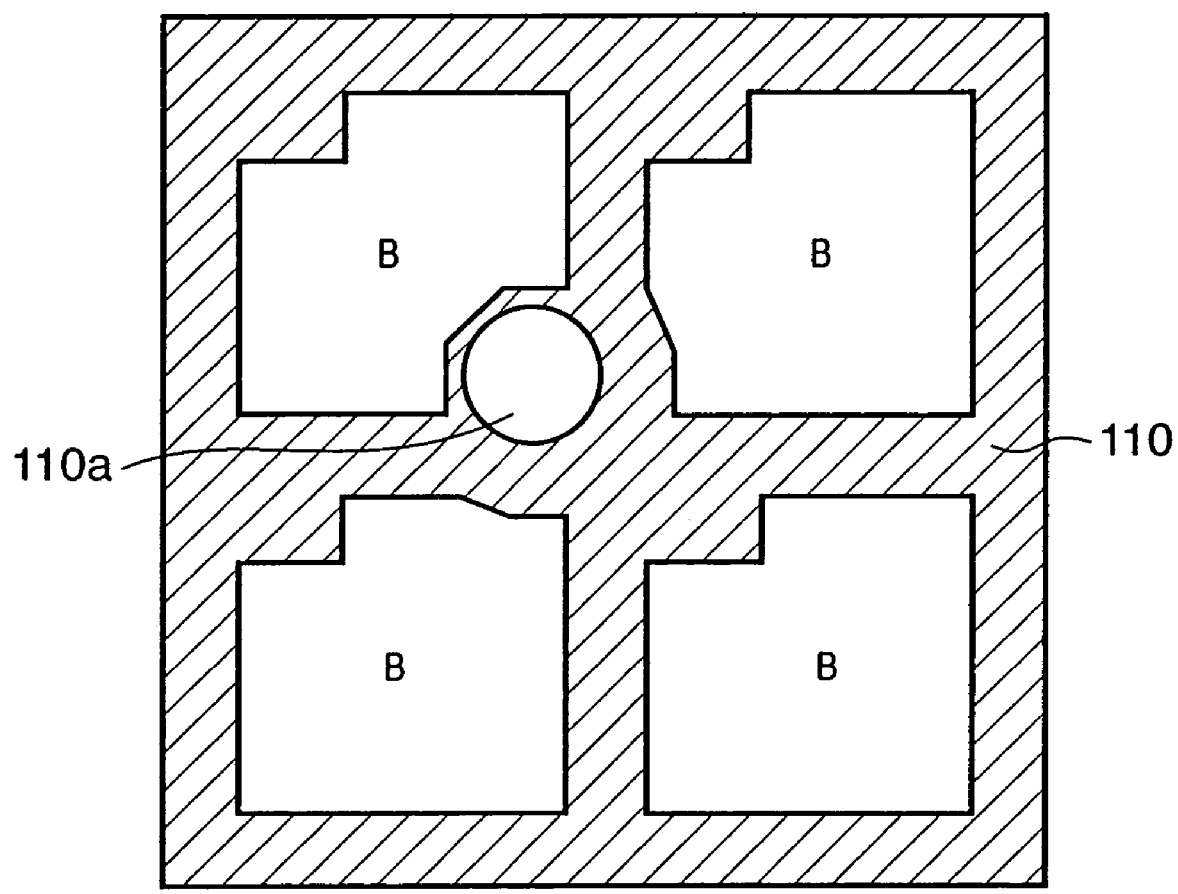
FIG. 25 is a plan view of a black matrix.

FIG. 25 is a plan view of the black matrix 110 which is formed on the top surface side in FIG. 24. An opening 110a is formed at a position corresponding to region F. Also, opening regions B are formed in correspondence with light-emitting regions A (i.e., the portions where the anodes 103 are formed).

Although not shown in FIGS. 23 to 25, the cathode 108 has an opening at a position corresponding to opening 110a. Note that the anode 103 can be formed on region F since it is a transparent electrode such as ITO or the like. However, in this embodiment, the anode 103 is not formed on that region.

In this embodiment, the opening 110c is formed at a position shifted from the center of the four display pixels, as shown in FIGS. 24 and 25. This is to avoid the TFT 181 of the lower right display pixel 180 in FIG. 24, thus eliminating process complexity. Therefore, the optical axis L1 of the lens 115a is formed at a position offset from the center of the two display pixels 180. In FIGS. 23 to 25, since the image sensing means has the same structure as that in the first embodiment, an illustration and description thereof will be omitted.

FIG. 26 is a block diagram showing the electrical arrangement of the display means 113. An organic EL display device 41 comprises the display panel 130, a gate driver 190, and a source driver (data driver) 191.

The display panel 130 has gate lines (scan lines) $G_1, \ldots, G_n, G_{n+1}, \ldots, G_m$, and source lines (data lines) $S_1, \ldots, S_n, S_{n+1}, \ldots, S_m$. The gate lines $G_1$ to $G_m$ and the source lines $S_1$ to $S_m$ intersect each other, and display pixels 180 are provided at their intersections. That is, the display pixels 180 arranged in a matrix form the display panel 130.

The gate lines $G_1$ to $G_m$ are connected to the gate driver 190 and are applied with gate signals (scan signals). The source lines $S_1$ to $S_m$ are connected to the source driver 191 and are applied with data signals. These drivers 190 and 191 form a peripheral drive circuit 192. Note that the gate lines $G_1$ to $G_m$ are formed of the gate electrodes 184 of the TFTs 181. The source lines $S_1$ to $S_m$ are formed of the source electrodes 186 of the TFTs 181.

Figure 27:
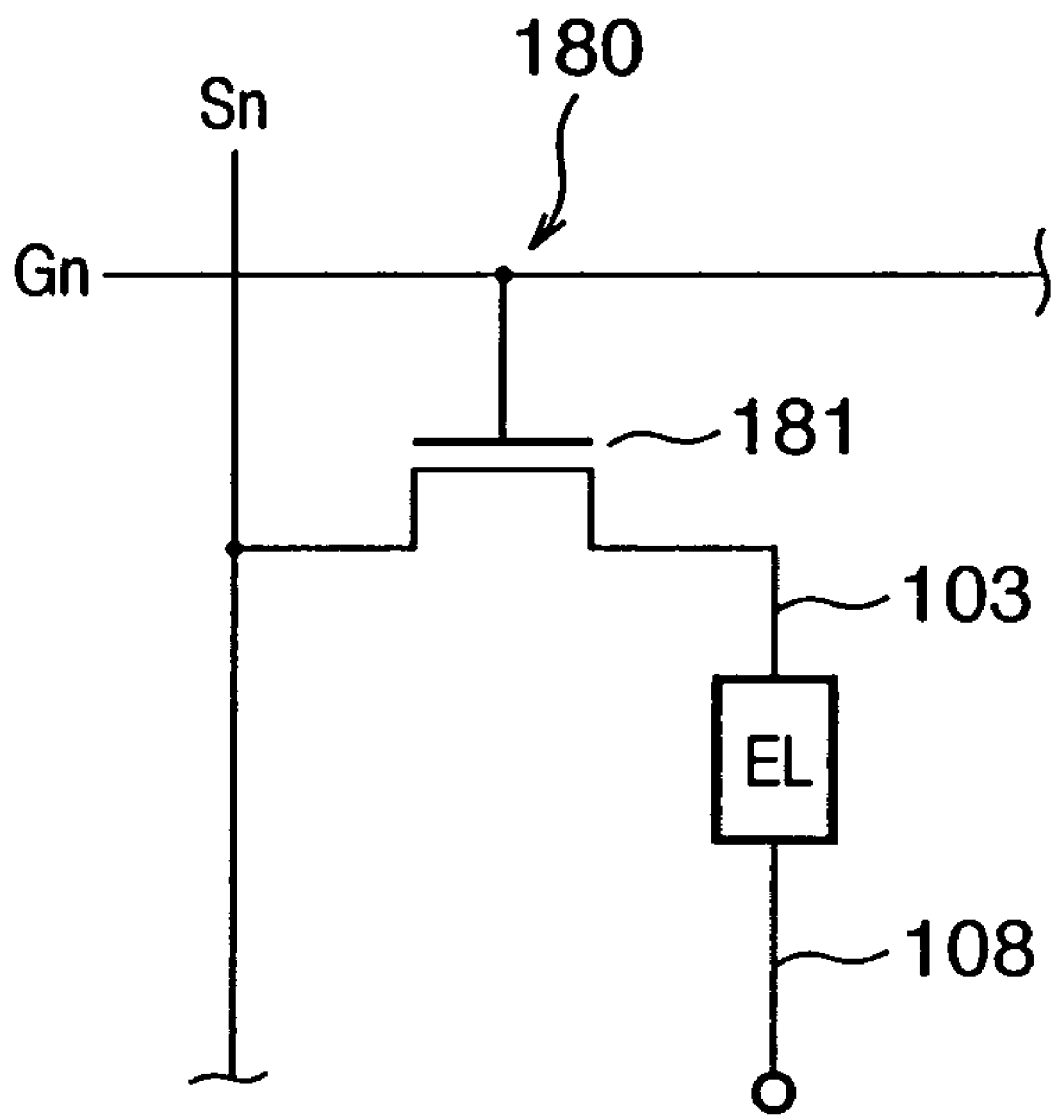
FIG. 27 is a circuit diagram showing an equivalent circuit of a display pixel.

FIG. 27 shows an equivalent circuit of the display pixel 180 formed at the intersection between the gate line $G_n$ and source line $S_n$. The cathode 108 of an organic EL element 190 is applied with a constant voltage $V_{com}$.

In the display pixel 180, when a positive voltage is applied to the gate electrode 184 of the TFT 181 while the gate line $G_n$ is set at a positive voltage, the TFT 181 is turned on. Then, the capacitance of the organic EL element 190 is charged by a data signal applied to the source line $S_n$, and the data signal is written in the display pixel 180. That data signal drives the organic EL element 109. Conversely, when a negative voltage is applied to the gate electrode 184 of the TFT 181 while the gate line $G_n$ is set at a negative voltage, the TFT 181 is turned off. The data signal applied to the source line $S_n$ at that time is held as a charge by the capacitance of the organic EL element 109. In this way, when data signals to be written in the display pixels 180 are applied to the source lines $S_1$ to $S_m$, and the voltages to be applied to the gate lines $G_1$ to $G_m$ are controlled, the display pixels 180 can hold arbitrary data signals. The organic EL element 109 is continuously driven until the TFT 181 is turned on next time.

Therefore, even when the number of gate lines (the number of scan lines) increases and the drive time that can be assigned per pixel 180 becomes short, it does not influence driving of the organic EL element 109, and the contrast of an image displayed on a display panel 130 never drops. Therefore, according to the display means 113 of the active matrix system, display with higher image quality than the display means 113 of the simple matrix system of the first embodiment can be attained. Since the same image sensing means as in the first and second embodiments is adopted, an image sensing operation which can catch the eye of a partner can be realized without deteriorating the display quality.

Fifth Embodiment

The fifth embodiment is a modification of the first embodiment, and improves the quality of a sensed image by increasing the number of lens surfaces of the image sensing means.

Figure 28:
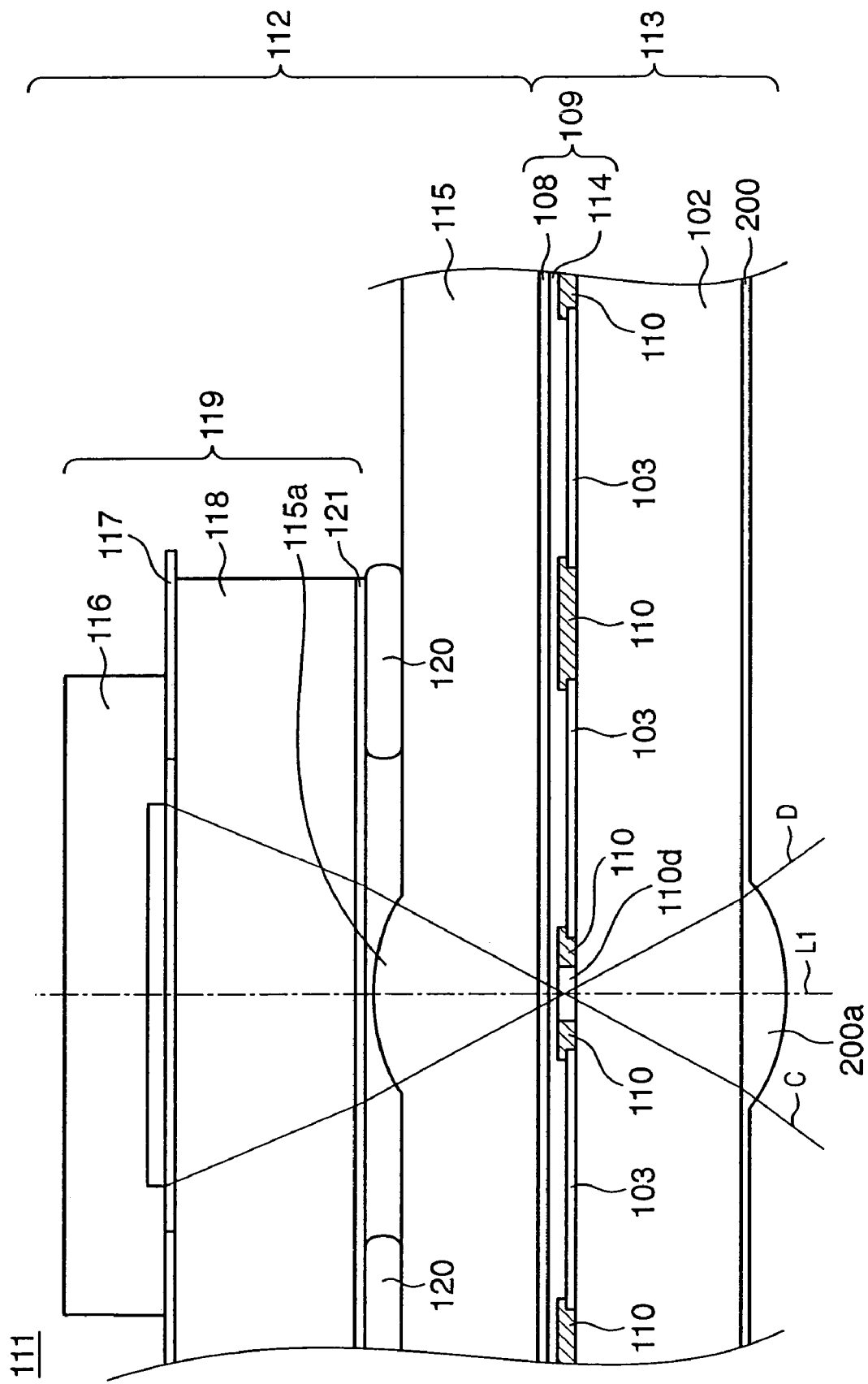
FIG. 28 is a partially enlarged, schematic sectional view of a display device with an image sensing device according to the fifth embodiment.

FIG. 28 is a partially enlarged, schematic sectional view of a display device with an image sensing device.

Referring to FIG. 28, a replica layer 200 is formed on a transparent insulating substrate 102 on the side opposite to a lens 115a, and a lens 200a having an axis common to an optical axis L1 is also formed. The lens 200a is an optical lens surface defined by an aspherical surface as in the lens 115a. An opening 110a is formed between the lenses 200a and 115a, and an object image is formed by the two optical surfaces of the lenses 200a and 115a.

In this way, by increasing the number of optical surfaces that contribute to image formation from one to two, the optical performance of an object image to be formed can be improved. Especially, when an aperture stop is arranged between the two convex surfaces, light rays which pass near the center of the aperture stop undergo nearly no refraction by the convex surfaces, thus satisfactorily correcting distortion.

Since the lens 200a formed on the display panel side of the display means 113 has a lens diameter larger than the region of the black matrix 110, the user visually observes display pixels near the opening 110a via the lens 200a. However, since the lens 200a is transparent and is sufficiently smaller than the size of the display panel 130, the influence on display is small. In order to minimize such influence, it is effective to make optical design so as to reduce the diameter of the lens 200a.

Sixth Embodiment

The sixth embodiment is directed to a display device with an image sensing device, which comprises a large number of image sensing means in the first embodiment. By providing a large number of image sensing means, interactive real-time, two-way communications that allow the user to catch the eye of a partner can be implemented even when large display means is adopted.

Figure 29:
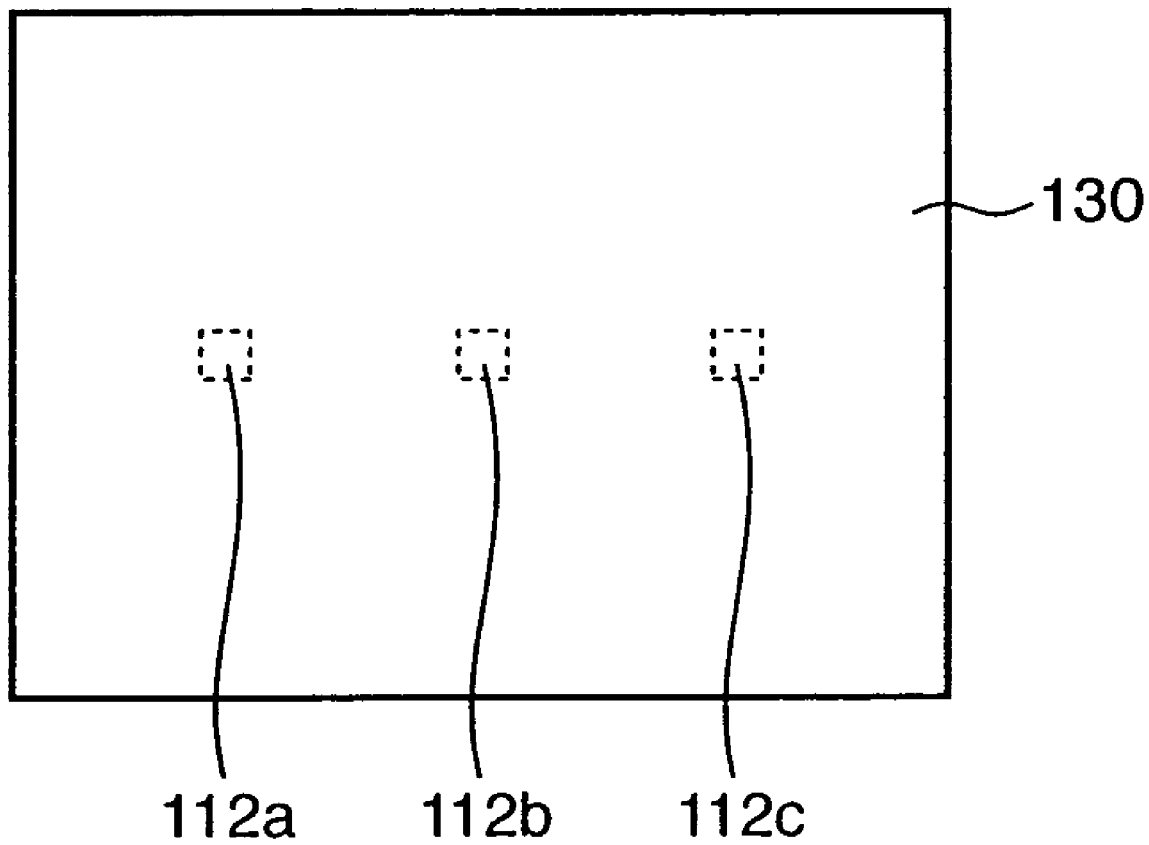
FIG. 29 is a plan view showing a display panel of a display device with an image sensing device, which comprises many image sensing means.

FIG. 29 is a plan view showing a display panel 130 of a display device with an image sensing device with a large number of image sensing means. In FIG. 29, three dotted rectangles correspond to image sensing means 112a, 112b, and 112c, which are integrally formed on the back surface side, as has been explained in the first embodiment. Note that the openings of these image sensing means are formed to be an integer multiple of display pixels, since the degree of freedom in design of the opening diameter can be improved, as has been described in the third embodiment.

Figure 30:
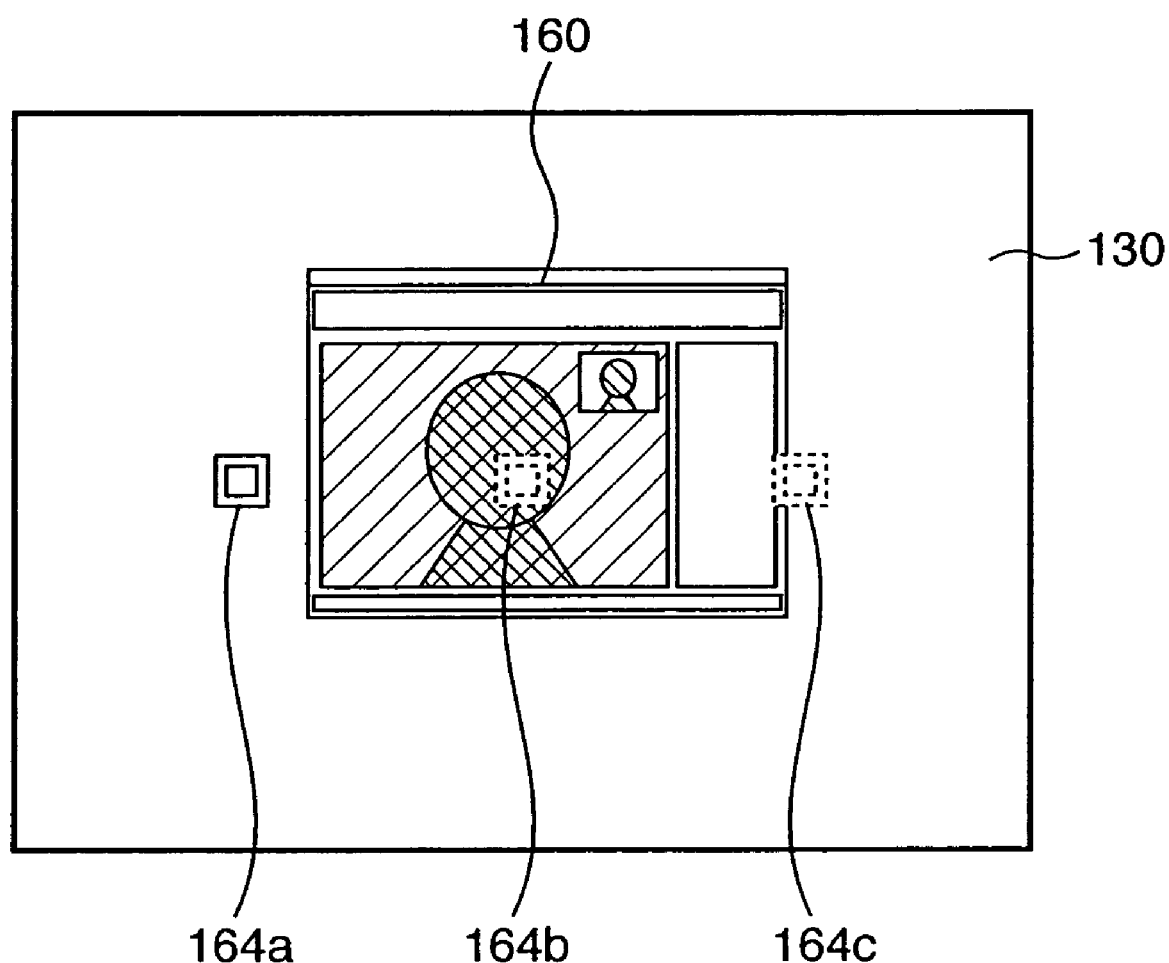
FIG. 30 is a schematic view showing a display state of application software on the display panel.

FIG. 30 is a schematic view showing a state wherein application software used to make two-way communications is displayed on the display panel 130. An application window 160 comprises user interfaces such as an image display field, console, and the like. Since this embodiment comprises the three image sensing means, three image sensing means position marks 164a, 164b, and 164c are displayed at corresponding positions. Of these image sensing means position marks 164a to 164c, only the image sensing means position mark corresponding to the currently active image sensing means is displayed. In this state, only the image sensing means position mark 164a corresponding to the image sensing means 112a is displayed. The image sensing means position marks 164b and 164c indicated by the dotted lines in FIG. 30 are currently not displayed.

In this manner, the user can easily recognize the currently active one of the plurality of image sensing means by gazing the display panel. Note that the display ON/OFF states of these image sensing means position marks 164a to 164c can be arbitrarily set by user's setups as in the first embodiment.

Also, the user can arbitrarily designate which of these three image sensing means 112a to 112c is to be used. For example, using a known face recognition technique that has been put into practical use in recent years, the image sensing means 112a to 112c may be automatically switched by tracing the user's face, thus improving the convenience.

The effects of the plurality of image sensing means 112 especially when large display means 113 is adopted will be explained below using FIGS. 31 and 32.

Figure 31:
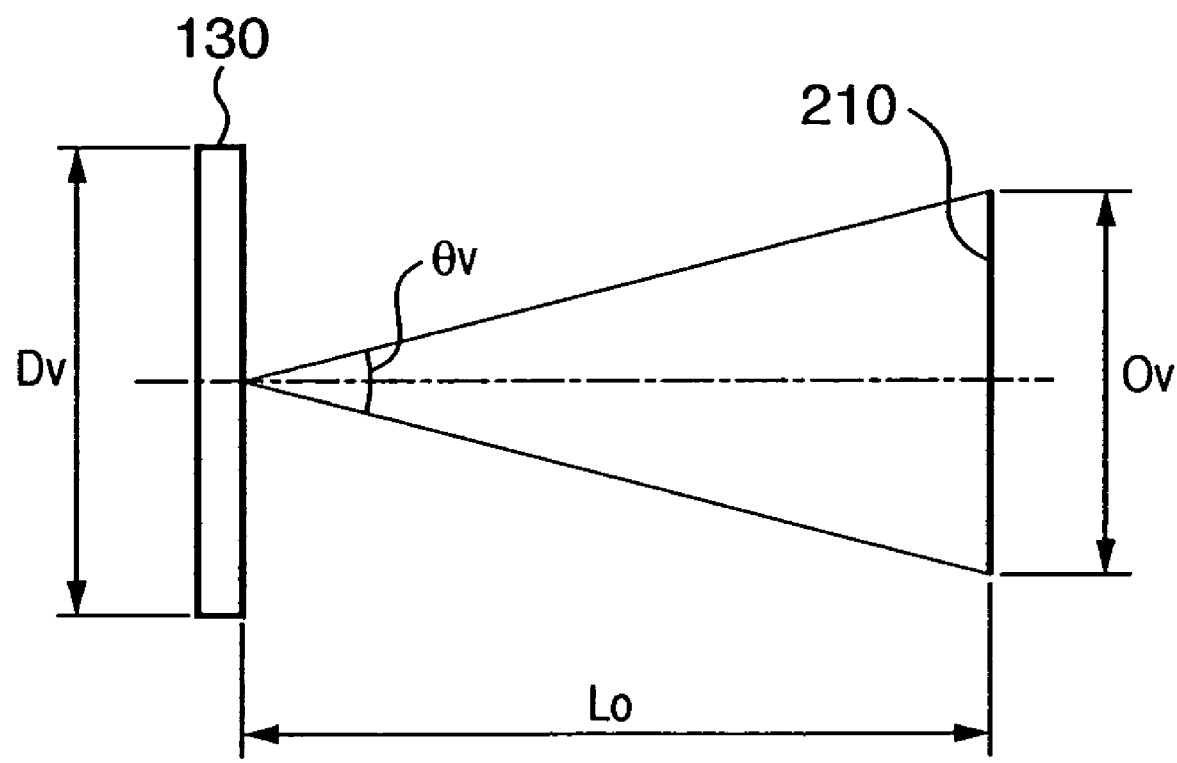
FIG. 31 is a plan view of the display panel in FIG. 29 when viewed from the side surface side.

FIG. 31 is a plan view of the display panel 130 in FIG. 29 when viewed from the side surface side, and shows the relationship between the display panel 130 and photographing field angle. In FIG. 31, the one-dashed chain line indicates the optical axis of each of the image sensing means 112a to 112c. Reference numeral 210 denotes an object plane. Line segments that connect the intersection between the optical axis and display panel 130, and the object plane 210 indicate photographing outermost light rays in the vertical direction. The optical axes of the three image sensing means 112a to 112c and photographing outermost light rays are illustrated, as shown in FIG. 31, since they overlap each other on the side view. Let θv be the vertical photographing field angle, and Dv, Ov, and Lo be the dimensions of respective members, as shown in FIG. 31.

Figure 32:
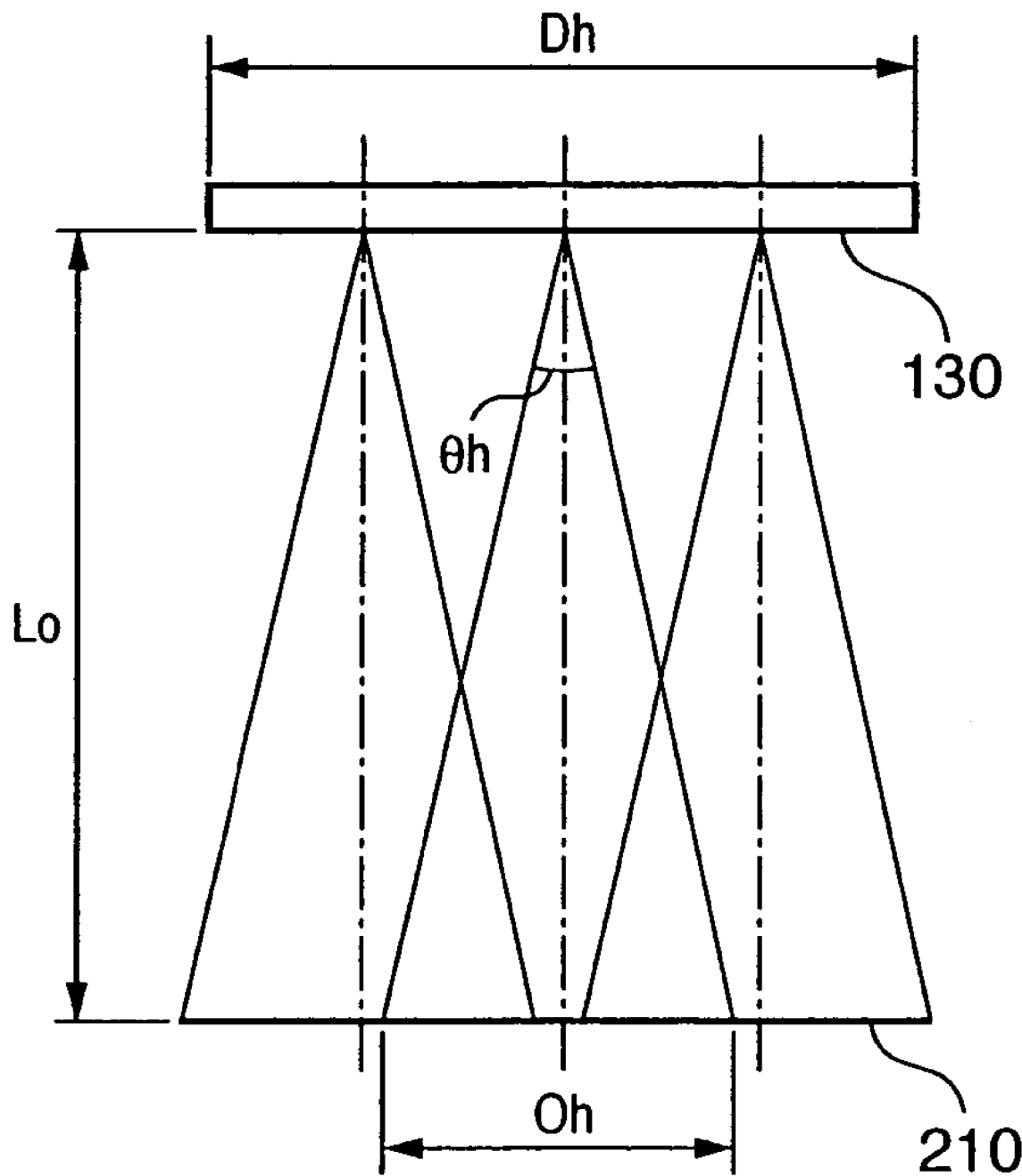
FIG. 32 is a plan view of the display panel in FIG. 29 when viewed from the top or bottom surface side.
Figure 33:
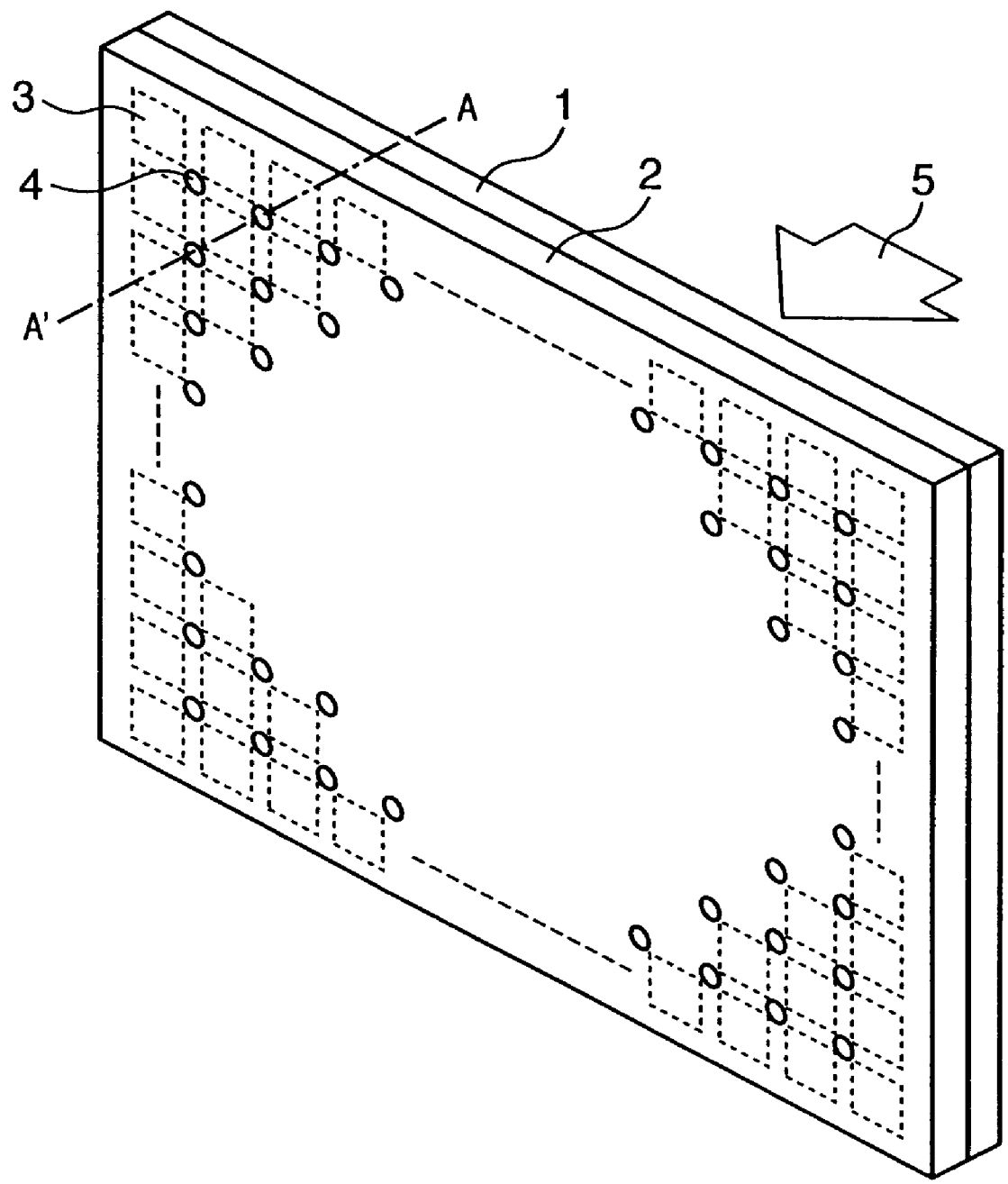
FIG. 33 is an overall perspective view of a conventional display device with an image sensing device.
Figure 34:
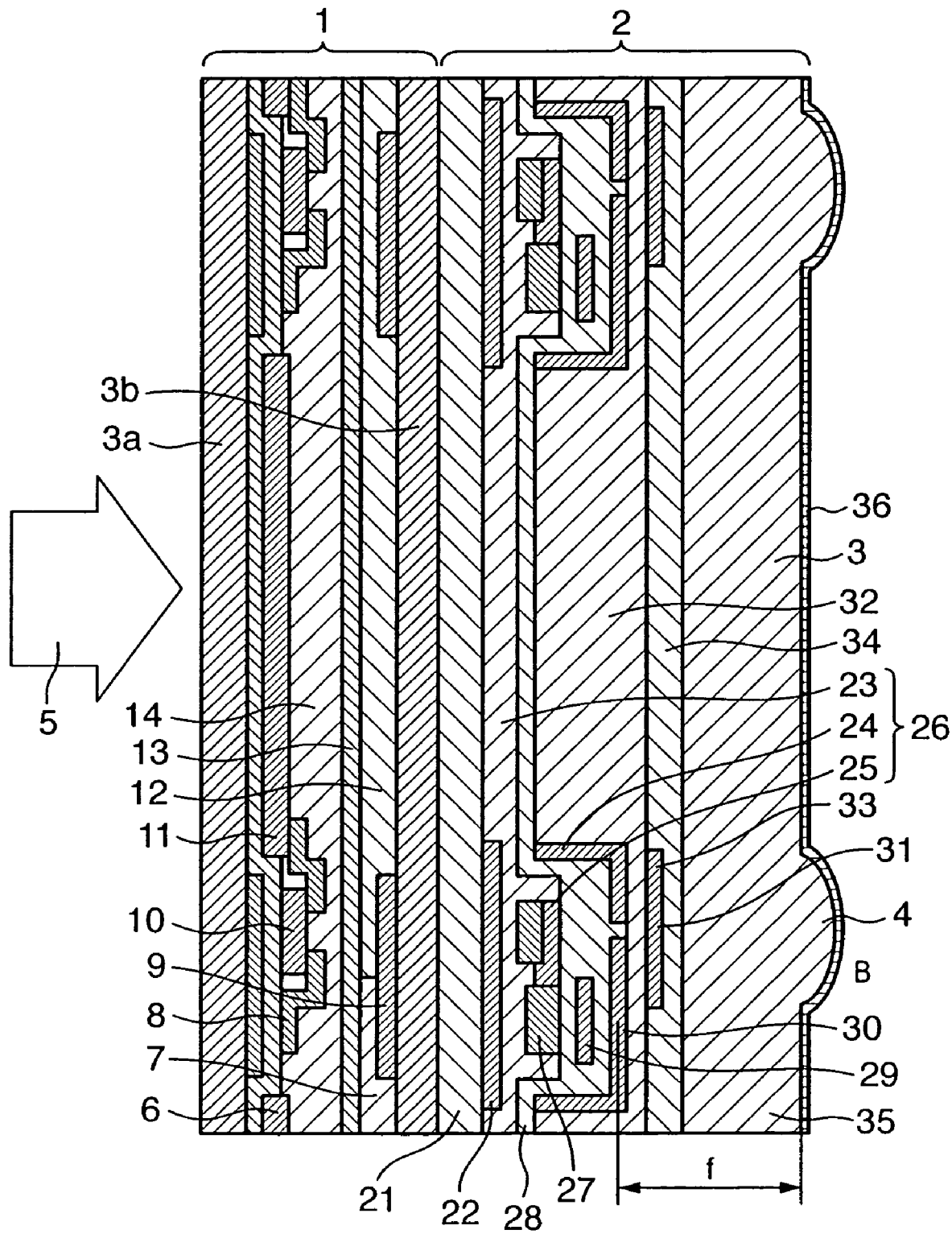
FIG. 34 is an enlarged sectional view taken along a line A-A' in FIG. 33.
Figure 35:
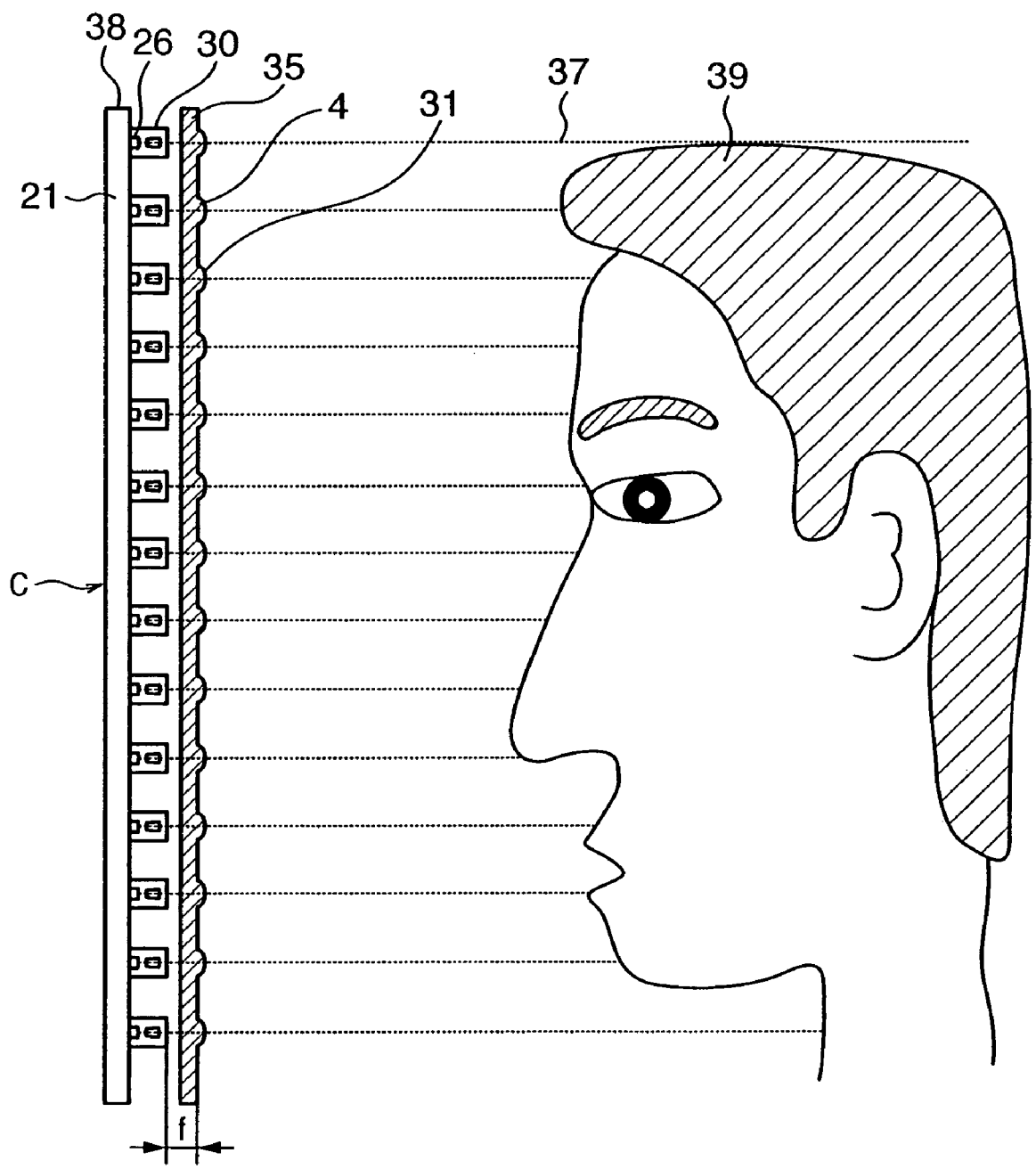
FIG. 35 shows the image sensing principle of an object in the prior art.

Likewise, FIG. 32 is a plan view of the display panel 130 in FIG. 29 when viewed from the top or bottom surface side, and shows the relationship between the display panel 130 and photographing field angle. In FIG. 32, the one-dashed chain lines indicate the optical axes of the image sensing means 112a to 112c. Reference numeral 210 denotes an object plane. Line segments that connect the intersections between the optical axes and display panel 130, and the object plane 210 indicate photographing outermost light rays in the horizontal direction. The photographing outermost light rays of the three image sensing means 112a to 112c intersect on neighboring image sensing means, as shown in FIG. 32, and this means that the photographing ranges overlap each other. Let θh be the horizontal photographing field angle of the central image sensing means, and Dh, Oh, and Lo be the dimensions of respective members, as shown in FIG. 32.

For example, when the display panel 130 is a large-size display having a diagonal length of 30", and has an aspect ratio 4:3 as a standard, Dh=609.60 mm and Dv=457.20 mm.

On the other hand, the object plane size, that is, the photographing range size, is preferably a size suited to take a bust shot of the user in consideration of the purpose of this device (i.e., a video phone). Hence, if Ov=500.00 mm and the aspect ratio is 4:3 (portrait), Oh=375.00 mm. The reason why the portrait photographing range is adopted is that a person is vertically elongated, and a convenient field angle can be obtained as a whole when a wider field angle is set in the vertical direction since the three image sensing means 112a to 112c are provided in the horizontal direction in this embodiment.

As for Lo, since the display panel 130 has a large size, Lo=800 mm.

When the field angles are calculated using a trigonometric function under the aforementioned conditions, θv=34.710 and θh=26.380. A field angle in the diagonal direction (i.e., a so-called photographing field angle), is 42.67°. Therefore, as can be seen from the above description, when the display panel has a large size, the field angle must be shifted toward the telephoto side compared to the first embodiment.

When such large display device has only the central image sensing means 112, the user must stay near the center of the screen in consideration of the ratio of Ov to Dv and that of Oh to Dh. However, since the plurality of image sensing means are laid out as in this embodiment, a broader range can be sensed at a suited field angle.

As described above, since this embodiment adopts the plurality of image sensing means, a broader range can be photographed at a field angle suited to photograph a person. Furthermore, which of the plurality of image sensing means is active is displayed. Hence, the user can-easily catch the partner's eye. In the above example, the display panel 130 has an aspect ratio 4:3 as a standard. If the display panel has an aspect ratio 16:9 as a wide standard, this embodiment is more effective.

In this embodiment, the image sensing means 112a to 112c are independently used. However, a plurality of ones of the image sensing means 112a to 112c may be used at the same time. In this case, a plurality of ones of the image sensing means position marks 164a to 164c are displayed at the same time, and overlapping sensed images are stitched and composited by an image process, thus obtaining a large image with a larger photographing field angle. Such arrangement is effective upon photographing a large number of persons in a video conference or the like.

As described above, according to the above embodiments, in a display device with an image sensing device, which comprises display means comprising a plurality of display panels and a light-shielding member between neighboring display pixels, and image sensing means, the light-shielding member has an opening for guiding light to the image sensing means, and imaging means is integrally arranged at a position corresponding to the opening. Therefore, a low-cost, low-profile display device with an image sensing device, which can match lines of sight while achieving both the display and image sensing operations can be realized.

Also, in a display device with an image sensing device, which comprises display means comprising a plurality of display panels and a light-shielding member between neighboring display pixels, and a plurality of image sensing means, the light-shielding member has a plurality of openings for guiding light to the image sensing means, and the plurality of openings are formed at a pitch corresponding to an integer multiple of the display pixel. Therefore, a low-cost, low-profile display device with an image sensing device, which can match lines of sight while achieving both the display and image sensing operations can be realized.

Furthermore, the display pixel near the opening is partially notched, and the plurality of image sensing means perform a pixel-shift photographing operation for an object at a predetermined distance. Therefore, a high pixel density can be realized by a low-cost arrangement, and a high-quality image free from any moiré stripes can be obtained.

As described above, according to the embodiments, the display device with the image sensing device can match lines of sight by a simple arrangement and can realize the high pixel density, low cost, and low profile.

Also, a high-quality image free from any moiré stripes can be obtained.

As many apparently widely different embodiments of the present invention can be made without departing from the spirit and scope thereof, it is to be understood that the invention is not limited to the specific embodiments thereof except as defined in the claims.

What is claimed is:

1. A display device with an image sensing device, comprising:
    display means comprising a plurality of display pixels, and a light-shielding member arranged between neighboring ones of the plurality of display pixels; and
    image sensing means arranged on a back portion of said display means, and
    wherein the light-shielding member has an opening for guiding light toward said image sensing means, and said image sensing means comprises an image forming lens at a position corresponding to the opening, and
    wherein a size of the display pixel, which corresponds to the opening, is smaller than a size of the display pixel which does not correspond to the opening.

2. A display device with an image sensing device, comprising:
    display means comprising a plurality of display pixels, and a light-shielding member arranged between neighboring ones of the plurality of display pixels; and
    a plurality of image sensing means each having an image forming lens and arranged on a back portion of said display means, and
    wherein the light-shielding member has a plurality of openings for guiding light toward said image sensing means, and the plurality of openings are arranged at a pitch corresponding to an integer multiple of the display pixel, and
    wherein a size of the display pixel, which corresponds to the opening, is smaller than a size of the display pixel which does not correspond to the opening.

3. The device according to claim 2, wherein said plurality of image sensing means perform a pixel-shift photographing operation for an object at a predetermined distance.

4. A display device with an image sensing device, comprising:
    a display device comprising a plurality of display pixels, and a light-shielding member arranged between neighboring ones of the plurality of display pixels; and
    an image sensing device arranged on a back portion of said display device,
    wherein the light-shielding member has an opening for guiding light toward said image sensing device, and said image sensing device comprises an image forming lens at a position corresponding to the opening, and
    wherein a size of the display pixel, which corresponds to the opening, is smaller than a size of the display pixel which does not correspond to the opening.

* * * * *